US007223611B2

(12) United States Patent  
Kornilovich et al.

(10) Patent No.: US 7,223,611 B2  
(45) Date of Patent: May 29, 2007

(54) FABRICATION OF NANOWIRES

(75) Inventors: Pavel Kornilovich, Corvallis, OR (US); Peter Mardilovich, Corvallis, OR (US); Kevin Francis Peters, Corvallis, OR (US); James Stasiak, Lebanon, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 225 days.

(21) Appl. No.: 10/683,527

(22) Filed: Oct. 7, 2003

(65) Prior Publication Data

US 2005/0072967 A1   Apr. 7, 2005

(51) Int. Cl.  
H01L 21/00 (2006.01)

(52) U.S. Cl. .................. 438/3; 438/2; 257/E29.072; 257/E29.298

(58) Field of Classification Search .................. 438/2, 438/3; 977/762; 257/E29.072, E29.298  
See application file for complete search history.

(56) References Cited

U.S. PATENT DOCUMENTS

| | | | |
|---|---|---|---|
| 2,744,970 A | 5/1956 | Shockley |
| 2,939,057 A | 5/1960 | Tezner |
| 3,929,610 A | 12/1975 | Wang |
| 3,964,296 A | 6/1976 | Matzuk |
| 5,008,616 A | 4/1991 | Lauks et al. |
| 5,118,801 A | 6/1992 | Lizardi et al. |
| 5,132,278 A | 7/1992 | Stevens et al. |
| 5,202,290 A | 4/1993 | Moskovits |
| 5,237,523 A | 8/1993 | Bonne et al. |
| 5,330,612 A | 7/1994 | Watanabe |
| 5,376,755 A | 12/1994 | Negm et al. |
| 5,418,558 A | 5/1995 | Hock et al. |
| 5,493,167 A | 2/1996 | Mikol et al. |
| 5,591,896 A | 1/1997 | Lin |
| 5,622,826 A | 4/1997 | Law et al. |
| 5,747,180 A | 5/1998 | Miller et al. |
| 5,767,521 A | 6/1998 | Takeno et al. |
| 5,772,905 A | 6/1998 | Chou |
| 5,780,710 A | 7/1998 | Murase et al. |
| 5,801,124 A | 9/1998 | Gamble et al. |
| 5,837,454 A | 11/1998 | Cozzette et al. |
| 5,837,466 A | 11/1998 | Lane et al. |

(Continued)

FOREIGN PATENT DOCUMENTS

JP   06175340   6/1994

(Continued)

OTHER PUBLICATIONS

Melosh, Nicholas A. et al., "Ultrahigh-Density Nanowire Lattices and Circuits," California Nanosystems Institute, University of California, Sciencexpress Report, Sciencexpress/www.sciencexpress.org/Mar. 13, 2003/ 10.1126/science.1081940, pp. 1-4.

(Continued)

*Primary Examiner*—Michelle Estrada

(57) ABSTRACT

This disclosure relates to a system and method for creating nanowires. A nanowire can be created by exposing layers of material in a superlattice and dissolving and transferring material from edges of the exposed layers onto a substrate. The nanowire can also be created by exposing layers of material in a superlattice and depositing material onto edges of the exposed layers.

19 Claims, 19 Drawing Sheets

U.S. PATENT DOCUMENTS

| | | | |
|---|---|---|---|
| 5,843,653 | A | 12/1998 | Gold et al. |
| 5,869,244 | A | 2/1999 | Martin et al. |
| 5,918,110 | A | 6/1999 | Abraham-Fuchs et al. |
| 5,972,710 | A | 10/1999 | Weigl et al. |
| 5,997,958 | A | 12/1999 | Sato et al. |
| 6,034,389 | A | 3/2000 | Burns, Jr. et al. |
| 6,120,844 | A | 9/2000 | Chen et al. |
| 6,150,097 | A | 11/2000 | Tyagi et al. |
| 6,150,106 | A | 11/2000 | Martin et al. |
| 6,231,744 | B1 | 5/2001 | Ying et al. |
| 6,238,085 | B1 | 5/2001 | Higashi et al. |
| 6,256,767 | B1 | 7/2001 | Kuekes et al. |
| 6,284,979 | B1 | 9/2001 | Malozemoff et al. |
| 6,294,450 | B1 | 9/2001 | Chen et al. |
| 6,355,436 | B1 | 3/2002 | Martin et al. |
| 6,359,288 | B1 | 3/2002 | Ying et al. |
| 6,360,582 | B1 | 3/2002 | Chelvayohan et al. |
| 6,365,059 | B1 | 4/2002 | Pechenik |
| 6,407,443 | B2 | 6/2002 | Chen et al. |
| 6,438,501 | B1 | 8/2002 | Szecsody et al. |
| 6,463,124 | B1 | 10/2002 | Weisman |
| 6,482,639 | B2 | 11/2002 | Snow et al. |
| 6,521,109 | B1 | 2/2003 | Bartic et al. |
| 6,562,577 | B2 | 5/2003 | Martin et al. |
| 6,643,491 | B2 | 11/2003 | Kinouchi et al. |
| 6,680,377 | B1 | 1/2004 | Stanton et al. |
| 6,694,800 | B2 | 2/2004 | Weckstrom et al. |
| 6,747,180 | B2 | 6/2004 | Ostgard et al. |
| 2001/0044200 | A1 | 11/2001 | Chen et al. |
| 2001/0046674 | A1 | 11/2001 | Ellington |
| 2002/0012937 | A1 | 1/2002 | Tender et al. |
| 2002/0055239 | A1* | 5/2002 | Tuominen et al. .......... 438/466 |
| 2002/0061536 | A1 | 5/2002 | Martin et al. |
| 2002/0117659 | A1 | 8/2002 | Lieber et al. |
| 2002/0130353 | A1 | 9/2002 | Lieber et al. |
| 2003/0089899 | A1 | 5/2003 | Lieber et al. |
| 2003/0132461 | A1 | 7/2003 | Roesner et al. |
| 2003/0148562 | A1 | 8/2003 | Luyken et al. |
| 2003/0162190 | A1 | 8/2003 | Gorenstein et al. |
| 2003/0170650 | A1 | 9/2003 | Karube et al. |
| 2003/0186522 | A1 | 10/2003 | Duan et al. |
| 2003/0189202 | A1 | 10/2003 | Li et al. |
| 2003/0219801 | A1 | 11/2003 | Lipshutz |
| 2003/0224435 | A1 | 12/2003 | Seiwart |
| 2004/0005723 | A1 | 1/2004 | Empedocies et al. |
| 2004/0005923 | A1 | 1/2004 | Allard et al. |
| 2004/0007740 | A1 | 1/2004 | Abstreiter et al. |
| 2004/0009510 | A1 | 1/2004 | Seiwart et al. |
| 2004/0028936 | A1 | 2/2004 | Kogiso et al. |
| 2004/0031975 | A1 | 2/2004 | Kern et al. |
| 2004/0043527 | A1 | 3/2004 | Bradley et al. |

FOREIGN PATENT DOCUMENTS

| | | |
|---|---|---|
| WO | WO 03/008954 A1 | 1/2003 |
| WO | WO2004012234 | 2/2004 |

OTHER PUBLICATIONS

Coleman, J. N. et al., "Percolation-dominated conductivity in a conjugated-polymer-carbon-nanotube composite," Rapid Communications, Physical B, vol. 58, No. 12, Sep. 15, 1998, The American Physical Society, pp. R7492-R7495.

Choi, et al; "Sublighographic nanofabrication technology for nanocatalysts and DNA Chips"; J. Vac. Sci. Technol. B 21(6), Nov./Dec. 2003; pp. 2951-2955.

Melosh, Nicholas A. et al., "Ultra-Density Nanowire Lattices and Circuits", California Nanosystems Institute, University of California, Sciencexpress Report, Sciencexpress/www.sciencexpress.org/ Mar. 13, 2003/ 10.1126/science.1081940, 12 pages.

International Search Report for Application No. PCT/US2004/032698, filed on Sep. 30, 2004. Report completed Jun. 9, 2005.

Covington, et al., "A polymer gate FET sensor array for detecting organic vapours," Sensors and Actuators B 77 Elsevier Science 2001, pp. 155-162.

* cited by examiner

Fig. 14
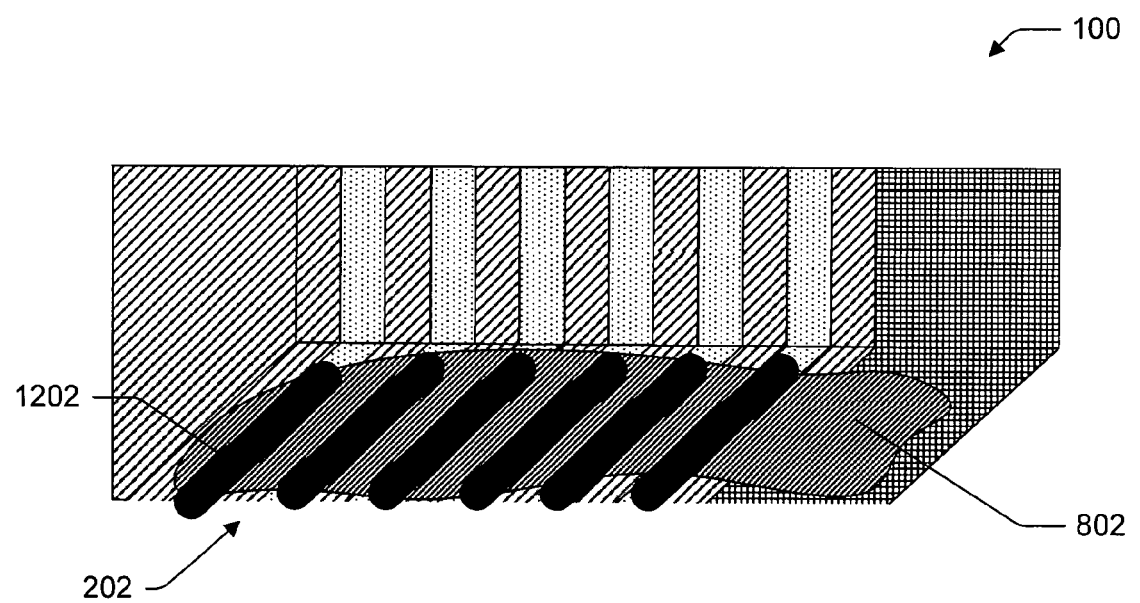
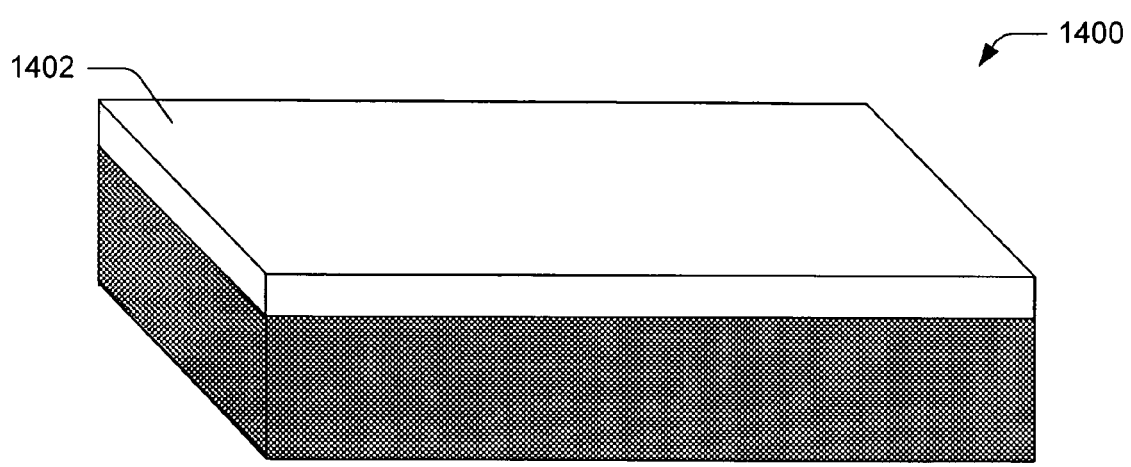

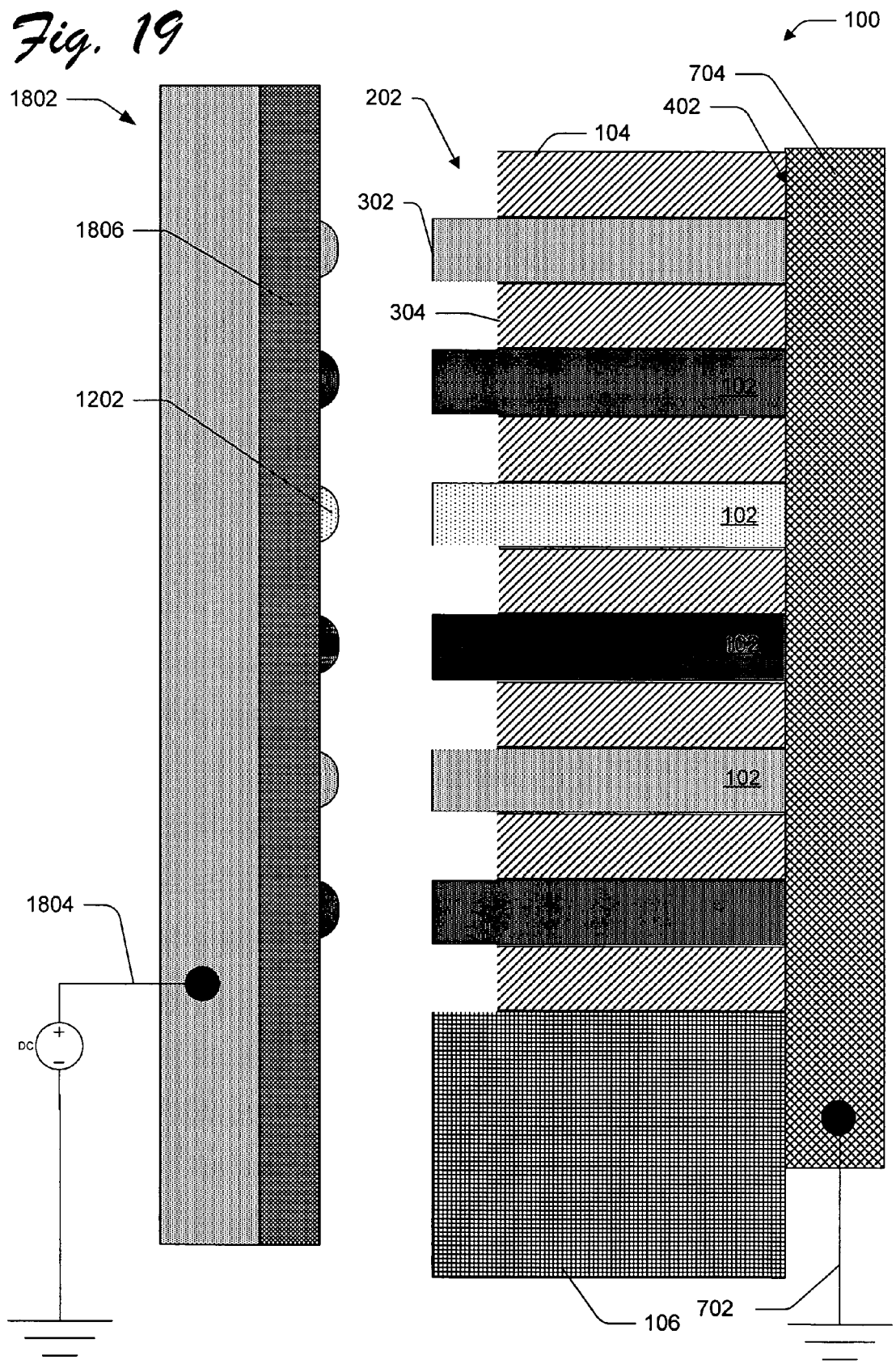

FABRICATION OF NANOWIRES

TECHNICAL FIELD

This invention relates to a system and method for fabricating nanowire arrays.

BACKGROUND

Prior art thin-wire arrays are used in a large number of devices, and have been found particularly suited for use in small or densely structured computer devices, such as sensors, memory devices, and logic chips.

To address this need for thin-wire arrays, thin-wire arrays have been created using photolithography. As computer devices get smaller and smaller, however, the wires of these arrays need to be thinner and more closely spaced. Photolithography has so far not proven to be an adequate method to create very thin and closely spaced arrays of wires.

To address this need for thinner arrays of wires, two ways of creating them have been used. One of these prior-art ways uses an etched superlattice as a mold for imprint lithography. The other uses an etched superlattice and physical vapor deposition to fabricate nanowire arrays.

Prior-art etched-superlattice imprint lithography is described in U.S. Pat. No. 6,407,443. This example of imprint lithography is typically associated inconveniently with subsequent lift-off processing and may ultimately have limited process capability. It also uses a nano-imprinting step, which has so far not been consistently and successfully used in a production atmosphere.

Prior-art physical vapor deposition uses an atomic beam to directly deposit material on a surface of an etched superlattice. This deposited material is then physically transferred to a substrate. This method, however, produces oddly shaped wires, which can create various structural and usage difficulties. Prior-art physical vapor deposition also can require processing in an Ultra-High Vacuum ("UHV"), which can be costly to use and would restrict the usage of materials that are incompatible with UHV processing.

There is, therefore, a need for a technique for manufacturing arrays of thinner wires that is reliable, less expensive, more reproducible, and more production-friendly than permitted by present-day techniques.

BRIEF DESCRIPTION OF THE DRAWINGS

FIG. 14 illustrates a three-dimensional view of an exemplary superlattice and an exemplary array substrate, the superlattice having material on its working surface.

FIG. 19 illustrates a side, cross-sectional view of an exemplary superlattice having alternating layers of materials that are corrugated along a working surface with one of the alternating layers including multiple materials, an electrical connection surface being in electrical communication with an electrical power sink, and an exemplary conductive receiving substrate being in electrical communication with an electrical power source and having materials from the working surface of the superlattice being deposited on a surface of the conductive receiving substrate.

The same numbers are used throughout the disclosure and figures to reference like components and features.

DETAILED DESCRIPTION

The following disclosure describes various embodiments of a system and method for electrochemically fabricating nanowire arrays. The described system and method can be used to fabricate arrays of wires with a thickness and spacing in a nano, micro, and meso scale and in combinations of these scales. The described system and method can be used to fabricate arrays of wires directly on the side of a superlattice. Such arrays can be used to fabricate secondary arrays of wires on a different substrate surface. Such secondary arrays can be used to fabricate further arrays of different wires on the same substrate surface. This nesting of capabilities for the processing of arrays provides great flexibility in material selection, process design, and the engineering of structures and devices.

The disclosed system and method is capable of creating an array of closely spaced, very thin wires. This type of array is capable of being used in current and future devices, allowing these devices to function better, more quickly, and be built on a smaller scale.

The disclosed system and method offer substantial benefits over many prior-art solutions. These benefits can include precise control of the dimensions of an array, such as a length, thickness, and spacing of wires, as well as a number of wires. The disclosed system can also provide smoother, more usable cross-sections of the wires than some prior-art solutions. Further, the cost of producing nanowire arrays can be reduced with this system and method, including by using a superlattice multiple times and not needing to use nano-imprinting, lift-off processes, or UHV, each of which can be costly. Also, nanowire arrays having wires of varying materials can also be created using the described system and method-a potentially substantial benefit.

An Exemplary Superlattice

FIGS. 1 through 4 set forth a superlattice usable in various processes discussed below for creating a nanowire array. This superlattice is one example of a superlattice usable in the below-discussed processes. Other superlattices can be used; this exemplary superlattice is not intended to be limiting on the scope of the below processes, but instead is intended to aid the reader in understanding the below-described processes.

Figure 1:
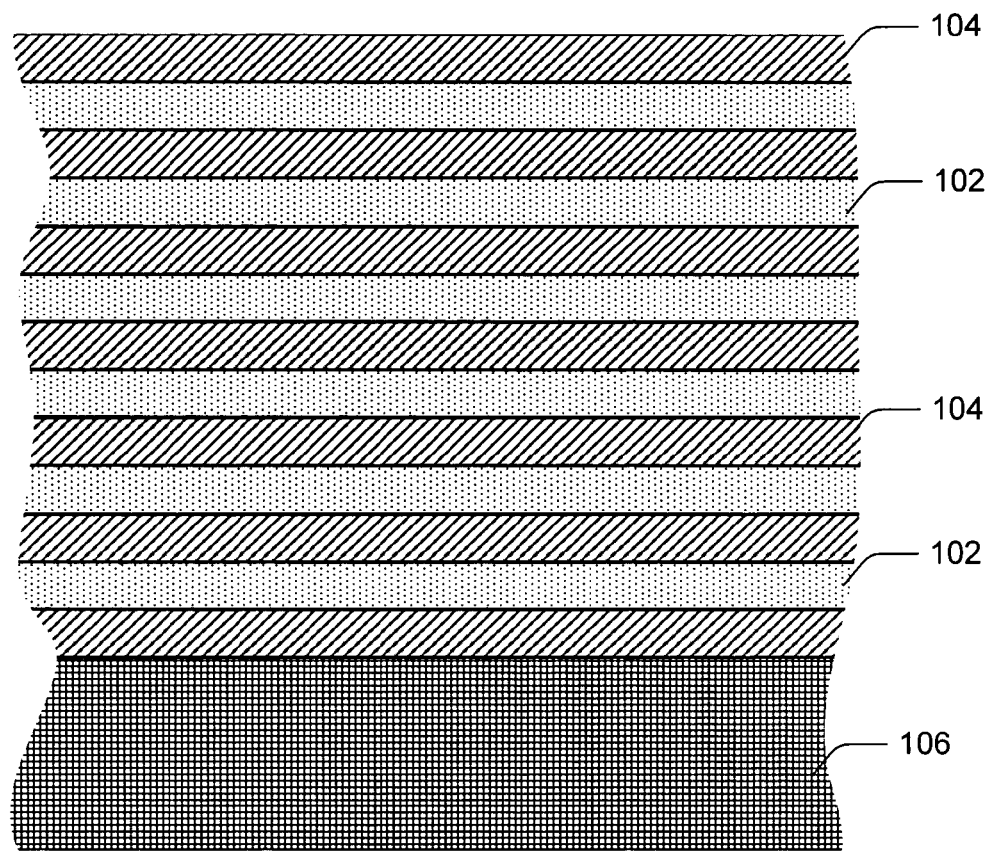
FIG. 1 illustrates a side, cross-sectional view of an exemplary superlattice.

FIG. 1 sets forth an exemplary superlattice 100, here shown at a side, cross-sectional view. The superlattice 100 includes at least two or more different layered materials, here first material layers 102 and second material layers 104. Either of these material layers can be layered on a substrate 106, or otherwise. Construction of the superlattice 100 shown in FIG. 1 can be performed in various ways, such as with chemical vapor deposition, sputtering and other methods of physical vapor deposition, atomic layer deposition, electroplating, and the like.

The layered materials alternate, such as shown in FIG. 1. The thickness of each of the layers 102 and 104 affects the process of creating a spacing (or "pitch") between wires and a thickness of the wires themselves, as will be set forth in greater detail below. The wire pitch/spacing are important, affecting the properties of the wires and of the array. Thus, the layers' thicknesses are also important.

Both of the first material layers 102 and the second material layers 104 can be of various thicknesses, including from nanometer in scale to micrometer and thicker in scale. The layers 102 and 104, for instance, can be created with a thickness of less than 10 nanometers, 10–15 nanometers, 15–20 nanometers, and 20 to 50 nanometers or more, or combinations thereof. The smallest layer thicknesses are used to produce wire arrays of the highest density and wires that exhibit extreme size-dependent properties such as quantum effects. The larger layer thicknesses provide for classical non-quantum properties, easier manufacturability, greater electrical conductance, more surface area, and less dense arrays.

The first material layers 102 can be made of various types of materials, including conductive materials and non-conductive materials. Of conductive materials, the first material layers 102 can include one or more metals such as platinum, beryllium, aluminum, palladium, tantalum, nickel, gold; metallic alloys; a ceramic such as indium tin oxide, vanadium oxide, or yttrium barium copper oxide; an electrically semiconductive material such as silicon, diamond, germanium, gallium arsenide, cadmium telluride, zinc oxide, silicon carbide, tin oxide, indium tin oxide; and/or other elemental, binary, and multi-component materials, for instance. Of the non-conductive materials, the first material layers 102 can include aluminum oxide, various other oxides, and other insulating materials that can be deposited in thin layers. The choice of material combination will be application-specific, and the process can be made to work with most any solid material that can be deposited as thin layers, including "soft" materials like polymers.

Likewise, the second material layers 104 can be made of various types of materials, including conductive materials and non-conductive materials, such as those described for the first material layers 102, above. Of the non-conductive materials, the second material layers 104 can include aluminum oxide, various other oxides, and other insulating materials that can be deposited in thin layers. Also the first material layers 102 and the second material layers 104 can be single-crystalline and/or in epitaxial relationship. Epitaxial refers to the perfect or near-perfect lattice registry of one material to another material upon which it is deposited.

Both the first material layers 102 and the second material layers 104 can be conductive, or one of them can be conductive and the other an insulator. In cases where both of the layers 102 and 104 are conductive, a surface that exposes the layers can be treated such that one exposed surface of either the first material layers 102 or the second material layers 104 is non-conductive, etched, or removed. These processes will be described in greater detail below.

Both of the first material layers 102 and the second material layers 104 can include more than one material. The first material layers 102 can, for instance, include layers some of which include gold, some of which include tantalum, some of which include nickel, and the like.

The superlattice 100 and the first material layers 102 and the second material layers 104 have a thickness, a length, and a depth. The first and second material layers 102 and 104 can have a length that is nanometer in scale up to centimeter in scale. Depending on the eventual application for the nanowire arrays, the wires may need to be very short (nanometer scale in length) or quite long (centimeter scale in length). As will be discussed in greater detail below, the eventual length of the wires in the nanowire array can be related to the length of the superlattice 100 and its first material layers 102 and/or its second material layers 104.

Figure 2:
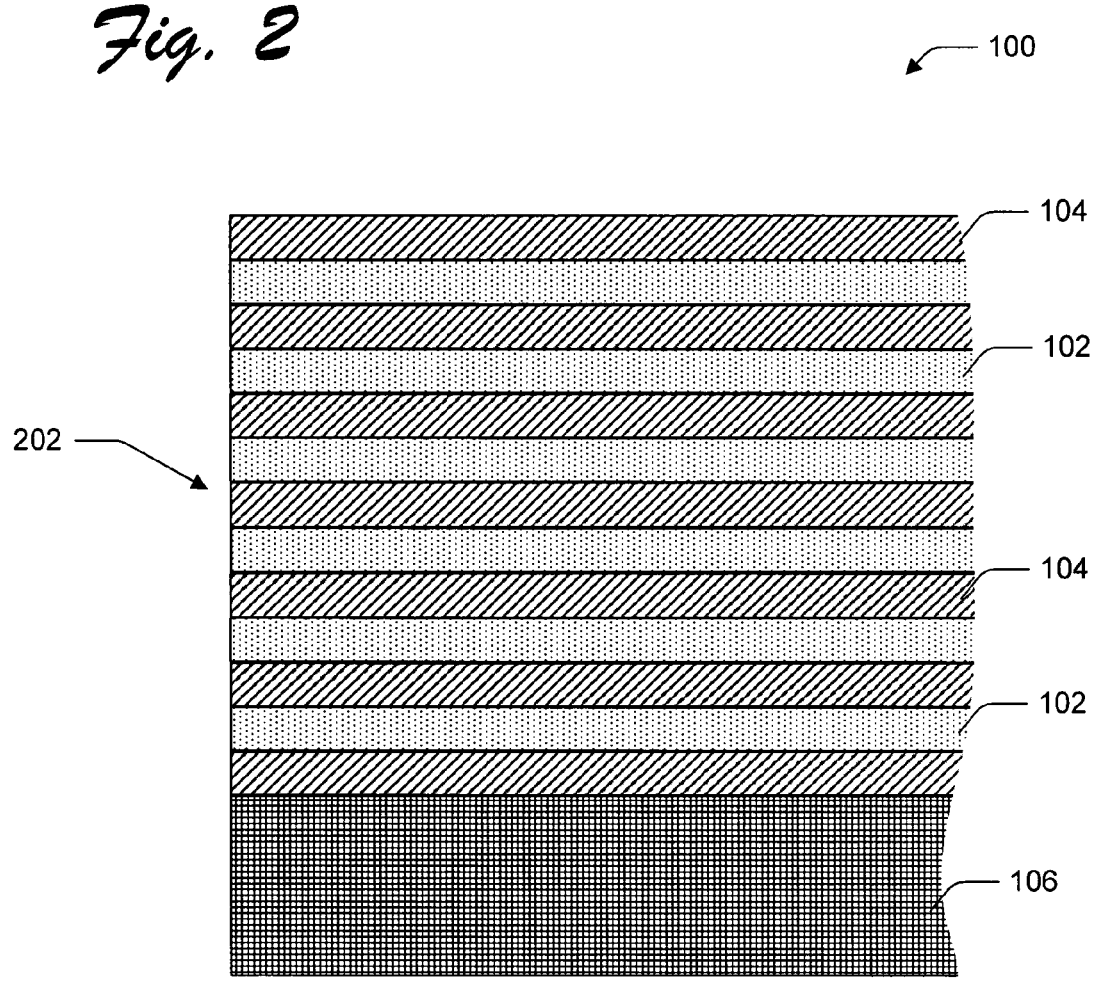
FIG. 2 illustrates a side, cross-sectional view of an exemplary superlattice having a working surface.

FIG. 2 sets forth an example of the superlattice 100, here shown at a side, cross-sectional view, and having a working surface 202. Here the superlattice 100 is altered to create the working surface 202. This working surface 202 is substantially level (planar) at some portion, this level portion being usable to aid in creating the wires of the nanowire array (discussed below). The working surface 202 can be created in various ways, including by cutting and polishing the superlattice 100.

The working surface 202 can be substantially parallel to a thickness of the first material layers 102 and the second material layers 104 or otherwise. If the working surface 202 is not substantially parallel to the material layers' 102 and 104 thickness, greater area of the material layers 102 and 104 will be exposed. With a greater area of the material layers 102 and 104 exposed, wires created with the working surface 202 can be created thicker than if the working surface 202 is substantially parallel to the thickness of the first and second material layers 102 and 104. If the working surface 202 is substantially parallel with the thickness of the material layers, the working surface 202 is usable to aid in creating wires and spaces between wires in the nanowire array that are about the same as the thickness of the first and second material layers 102 and 104.

Figure 3:
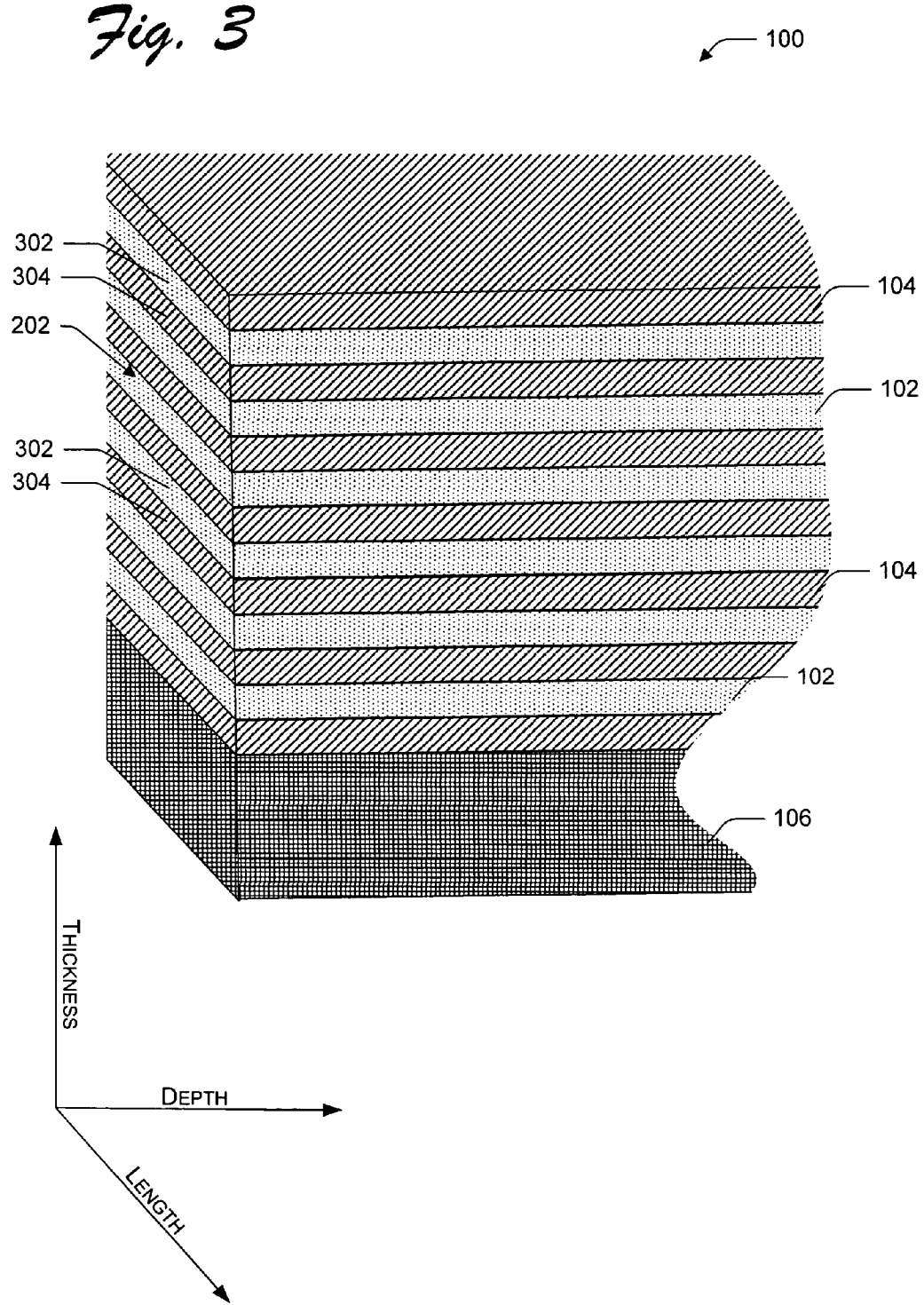
FIG. 3 illustrates a three-dimensional view of an exemplary superlattice having a working surface and a thickness, depth, and length dimensions.

FIG. 3 sets forth a three-dimensional view of an example of the superlattice 100 with the working surface 202. Here the working surface 202 is shown exposing multiple areas, or edges, of the first and second material layers 102 and 104. These edges are referenced as first material edges 302 and second material edges 304. These exposed edges 302 and 304 can be used to aid in creating wires of the nanowire array, as will be discussed in greater detail below.

Figure 4:
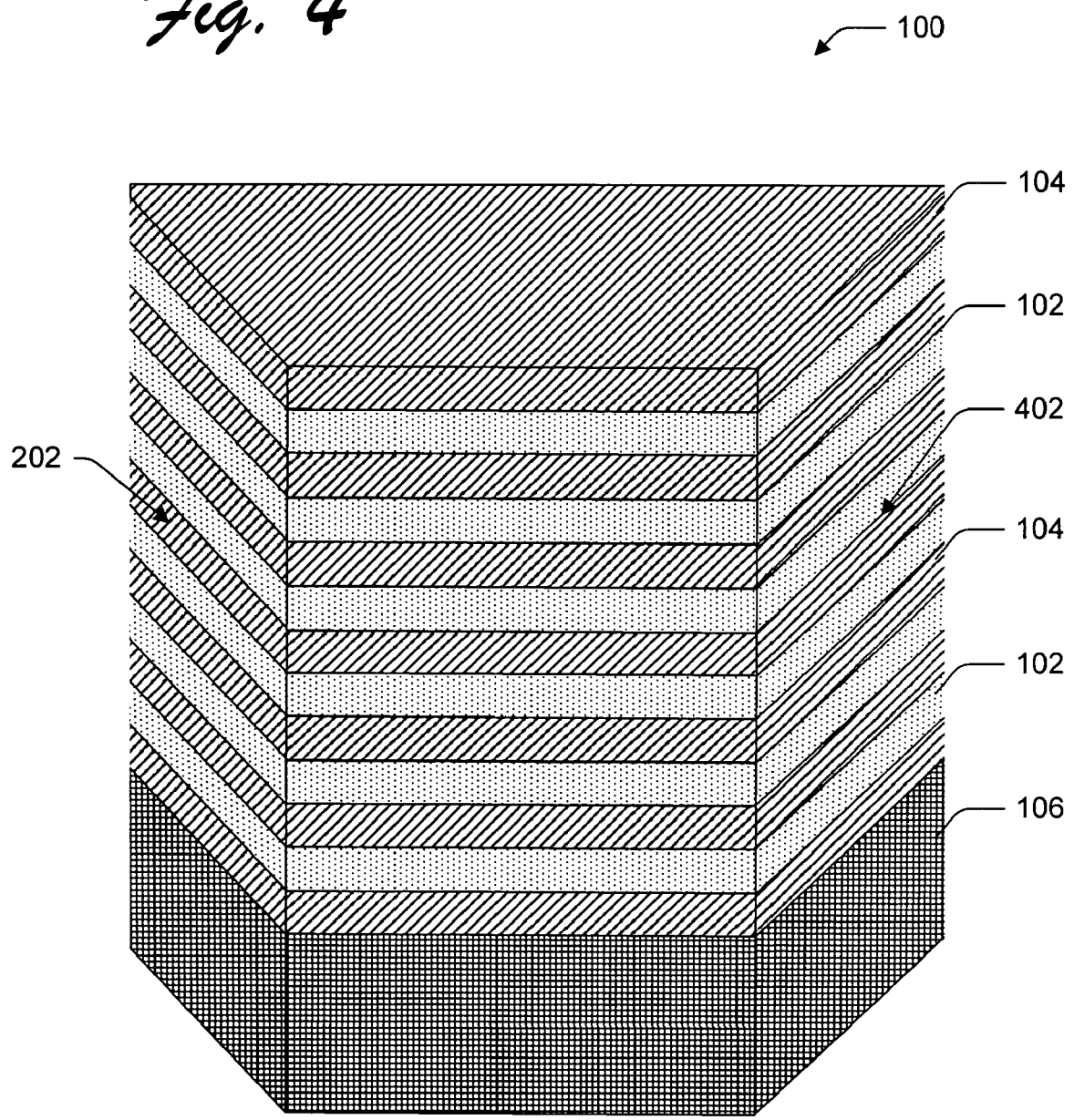
FIG. 4 illustrates a three-dimensional view of an exemplary superlattice having a working surface and an electrical connection surface.

FIG. 4 sets forth a three-dimensional view of an example of the superlattice 100 with an example of the working surface 202 and an exemplary electrical connection surface 402. Here the superlattice 100 is altered to create the electrical connection surface 402. The electrical connection surface 402 does not need to be substantially level at some portion, though connection to an electrical power sink can be easier if it is substantially level or planar. The electrical connection surface 402 can be created in various ways, including by cutting and polishing the superlattice 100.

Exemplary Platform for Creating Nanowire Arrays

Figure 5:
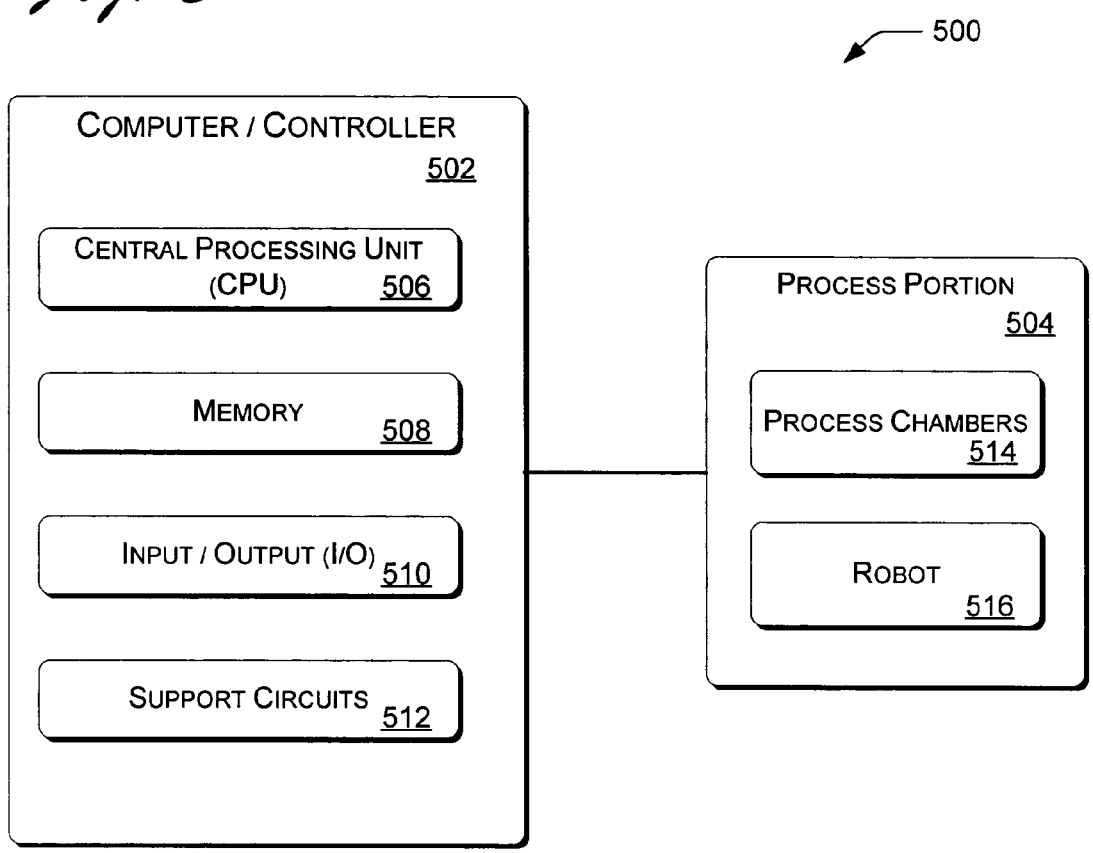
FIG. 5 shows a block diagram of an exemplary system that is capable of implementing methods for creating nanowire arrays.

FIG. 5 illustrates one embodiment of a platform 500 usable to perform methods set forth below for creating nanowire arrays. The platform 500 includes a computer/controller 502 and a process portion 504.

The computer/controller 502 includes a central processing unit (CPU) 506, a memory 508, input/output (I/O) circuits 510, and support circuits 512. The CPU 506 is a general purpose computer which, when programmed by executing software contained in memory 508 (not shown), becomes a directed-purpose computer for controlling the hardware components of the processing portion 504. The memory 508 may include read-only memory, random-access memory, removable storage, a hard disk drive, or any form of digital memory device. The I/O circuits 510 comprise well-known displays for the output of information and a keyboard, a mouse, a track ball, or an input of information that can allow for programming of the computer/controller 502 to determine the processes performed by the process portion 504 (including the associated robot action included in the process portion 504). The support circuits 512 are well known in the art and include circuits such as cache, clocks, power supplies, and the like.

The memory 508 contains control software that, when executed by the CPU 506, enables the computer/controller 502 to digitally control the various components of the process portion 504. A detailed description of the process that is implemented by the control software is described with respect to FIGS. 6 and 16.

In another embodiment, the computer/controller 502 can be analog. For instance, application-specific integrated circuits capable of controlling processes such as those that occur within the process portion 504 can be used.

The process portion 504 may include a variety of process chambers 514 between which the substrate 106 and/or the superlattice 100 is translated, often using a robot mechanism 516. The particulars of the processing varies with different methods described below.

Exemplary Methods for Creating Nanowire Arrays

Figure 6:
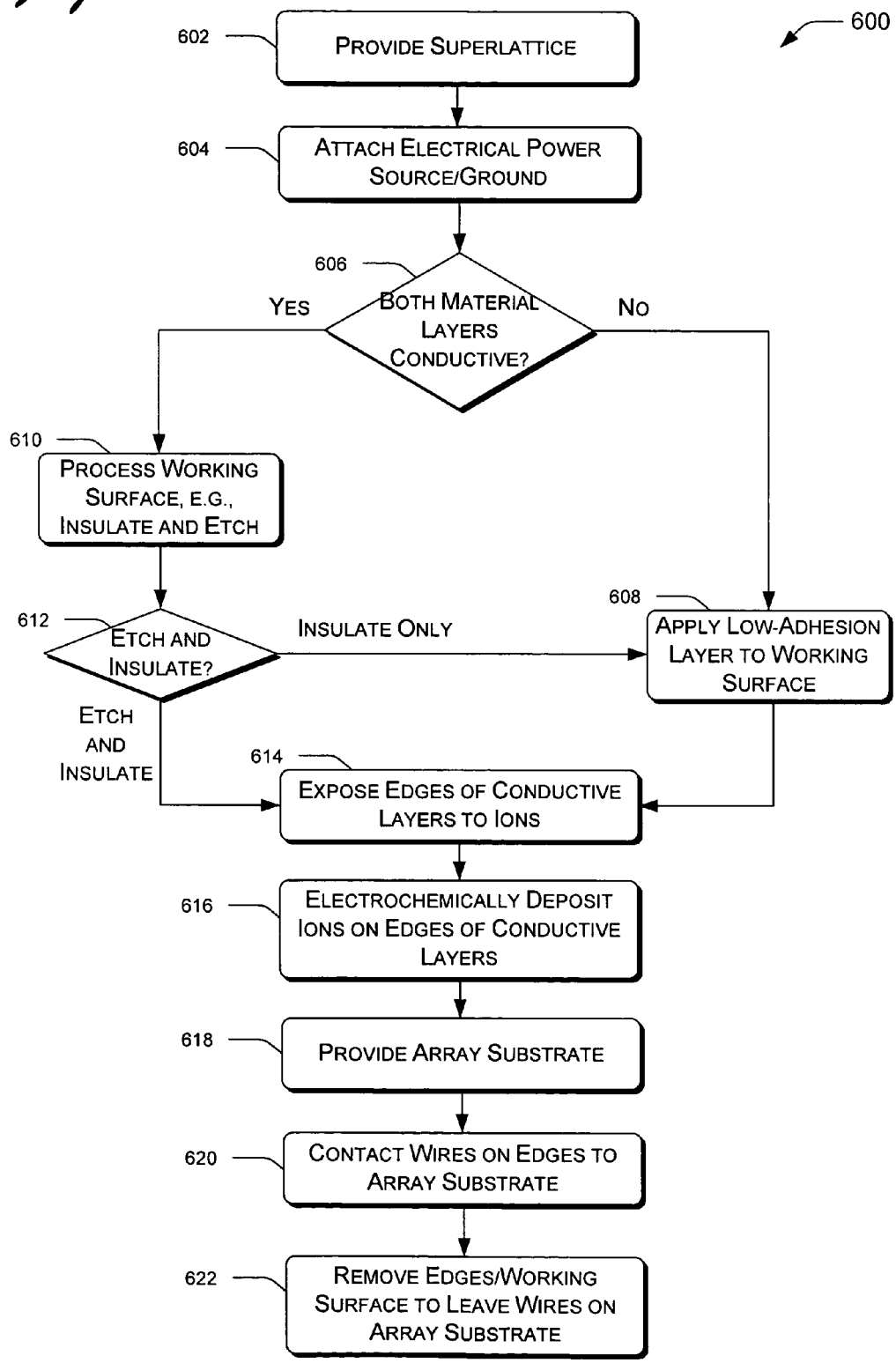
FIG. 6 is a flow diagram of an exemplary method for creating a nanowire array using electrochemistry and physical transfer.
Figure 16:
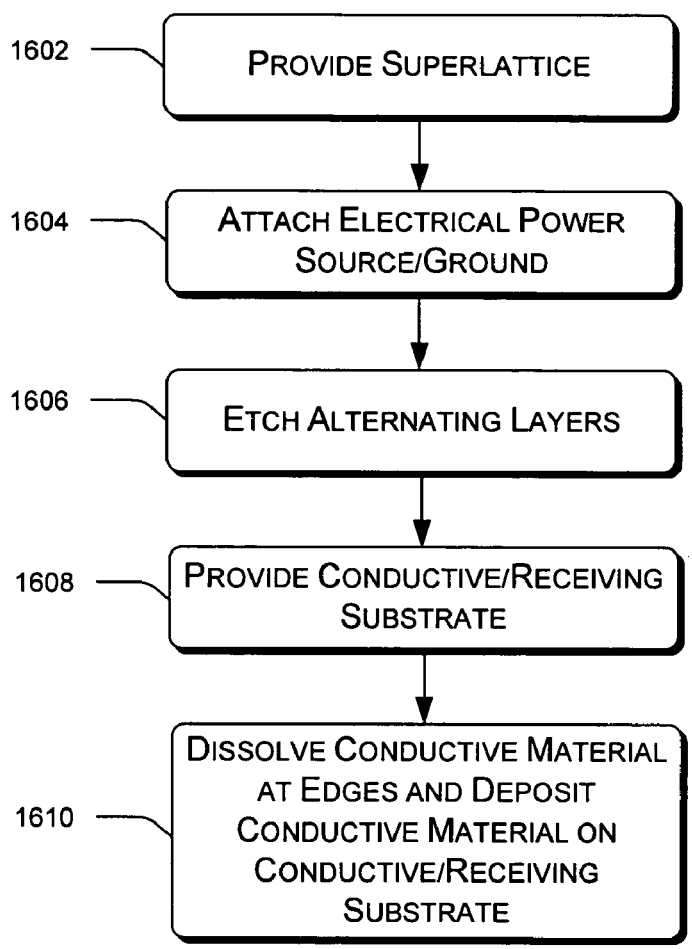
FIG. 16 is a flow diagram of an exemplary method for creating a nanowire array using ion transfer.

FIG. 6 shows a flow diagram 600 for electrochemically creating a nanowire array. This and the following flow diagram of FIG. 16 are illustrated as series of blocks representing operations or acts performed by the platform 500. These diagrams may be implemented, however, in any suitable robotics, persons, hardware, software, firmware, or combination thereof. In the case of software and firmware, they represent sets of operations implemented as computer-executable instructions stored in memory and executable by one or more processors.

At block 602 the superlattice 100 is provided.

At block 604, the superlattice 100 is attached or otherwise put in electrical communication with an electrical power source or an electrical ground (sink).

Figure 7:
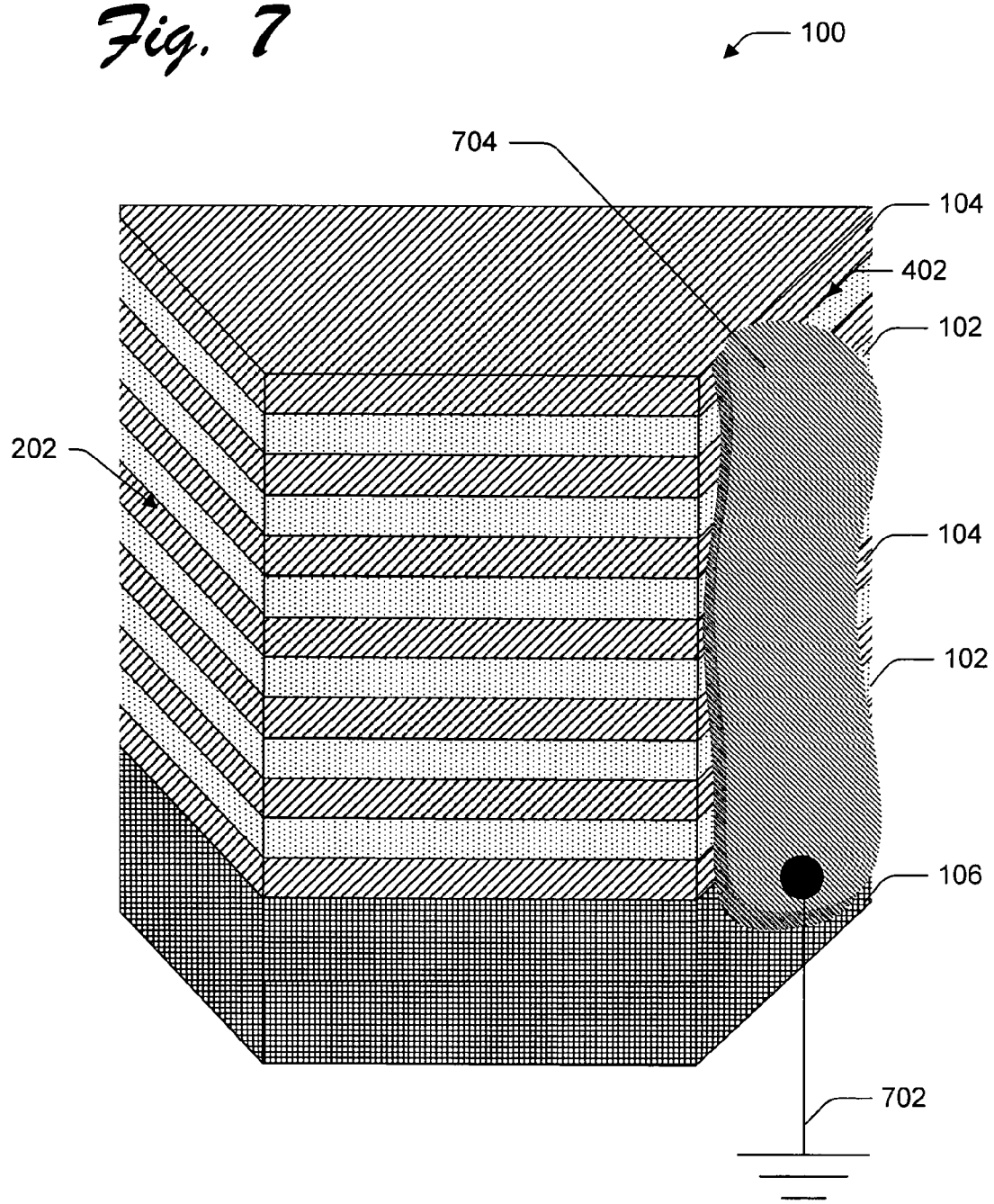
FIG. 7 illustrates a three-dimensional view of an exemplary superlattice having a working surface and an electrical connection surface in electrical communication with an electrical power sink.

FIG. 7 sets forth a three-dimensional view of an example of the superlattice 100 with examples of the working surface 202 and the electrical connection surface 402, the electrical connection surface 402 being in electrical communication with an electrical power sink 702.

With the electrical connection surface 402 being put in communication with the electrical power sink 702, there can be a voltage difference between the first and second material layers 102 and 104 at the working surface 202 and ions, conductive substrates, and other devices (not yet shown). This voltage difference can be used to transfer ions to or from the working surface 202 to create wires for a nanowire array. How this voltage difference can be used to facilitate creation of wires of a nanowire array will be discussed in greater detail below.

If material(s) of one of the first and second material layers 102 and 104 are non-conductors, and thus non-conductive from the working surface 202 to the electrical connection surface 402, the electrical connection surface 402 is constructed such that each layer of the other material layer (which is/are conductors) connects with the electrical power sink 702. In this case, the electrical connection surface 402 is prepared such that each conductive layer of the conductive material layer is in electrical communication with the electrical power sink 702. This can be accomplished by cutting and polishing the electrical connection surface 402 and then placing a conductive connection material 704 in contact with each of the conductive layers at the electrical connection surface 402. It can be accomplished in other ways as well, with the goal being that each layer of the conductive material layer be in communication with an electrical power sink if that layer is intended to be used to aid in creating a wire of the nanowire array.

If the materials of both the first and second material layers 102 and 104 are conductors, the electrical connection surface 402 can be prepared without the conductive connection material 704. In this case, the electrical power sink 702 can be connected directly to one or more of the layers, or to a smaller amount of material that is connected directly to one or more of the layers.

At block 606, if the materials in both of the first material layers 102 and the second material layers 104 are conductive, the platform 500 proceeds along the "No" path to block 608. If yes, the platform 500 proceeds along the "Yes" path to block 610.

At block 608, the platform 500 applies a low-adhesion layer to the working surface 202. This low-adhesion layer can be nano-scale in depth, or even less than one nanometer in depth. The low-adhesion layer should be thin enough and have properties such that it does not substantially interfere with a conductive property of the first or second material edges 302 or 304 that is conductive.

Figure 8:
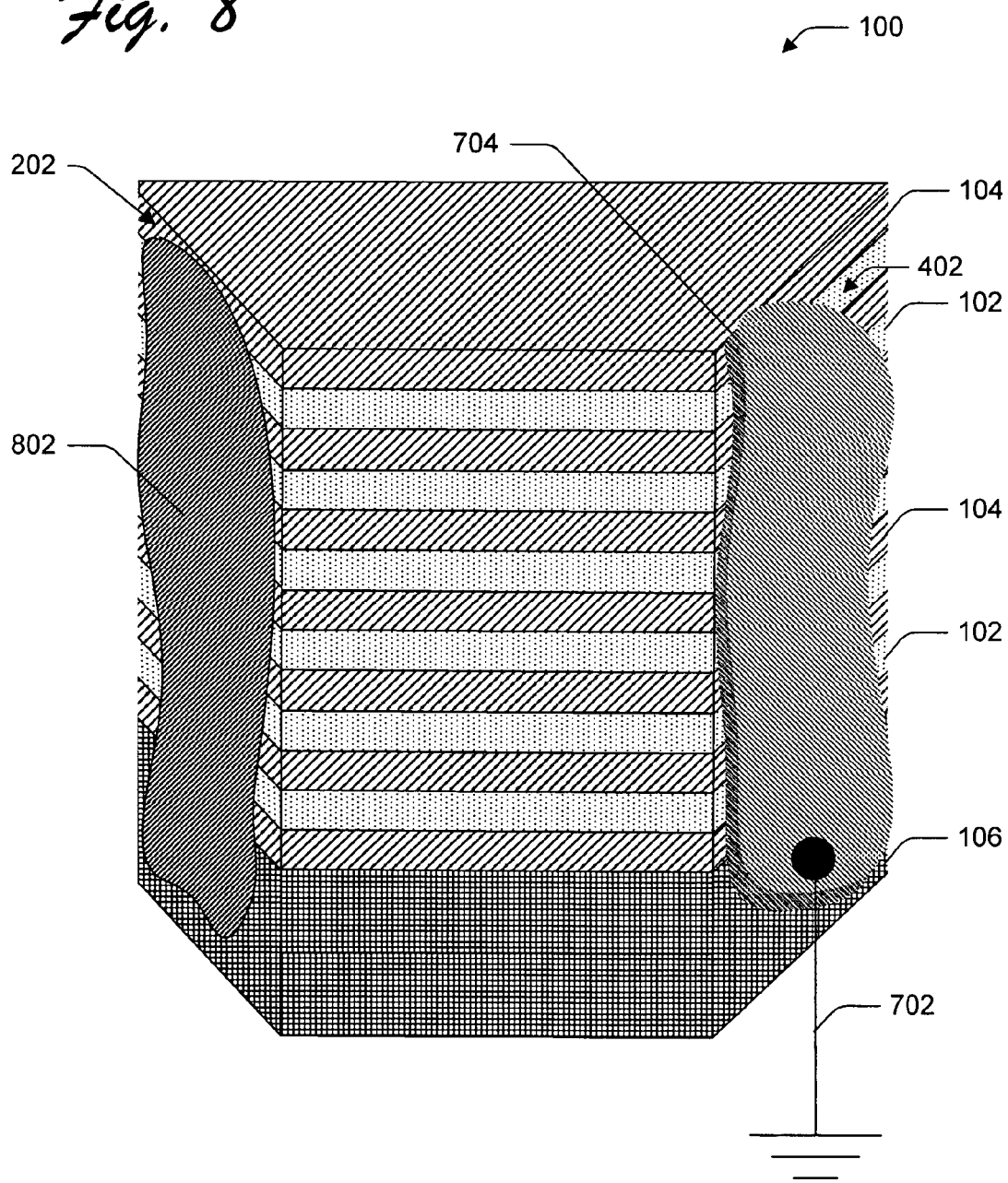
FIG. 8 illustrates a three-dimensional view of an exemplary superlattice having a working surface having a low-adhesion layer and an electrical connection surface in electrical communication with an electrical power sink.

FIG. 8 sets forth a three-dimensional view of an example of the superlattice 100 with examples of the working surface 202, the electrical connection surface 402, the electrical power sink 702, and an exemplary low-adhesion layer 802. In some implementations of the system and method, the low-adhesion layer 802 is added to the superlattice's 100 working surface 202. This low-adhesion layer 802 acts to allow wires that are created on the working surface 202 to more easily be removed from the working surface 202. The removal of these wires can be made easier by addition of the low-adhesion layer 802 by lowering adhesion between these wires (not shown in FIG. 8) and the working surface 202.

The low-adhesion layer 802 can be of varying adhesive force, from very low to moderately high adhesion. Some of the adhesion layer 802 can come off with the wires when the wires are removed from the working surface 202, or substantially all of it can remain with the working surface 202. The low adhesion layer 802 helps to reduce incidence of wires sticking to the working surface 202, or being broken or otherwise damaged on removal by too high an adhesion force between the wires and the working surface 202. It can have varying strength of adhesion, such as an adhesion strength to eventual wires created on the working surface 202 that is of a strength lower than the strength of an eventual substrate to which the wires are transferred. To reduce the amount of the low-adhesion layer sticking to the wires, the low-adhesion layer can adhere to the working surface 202 with greater force than to the wires.

In other implementations, the low-adhesion layer 802 is not used. These implementations will be discussed in greater detail below.

At block 610, the platform 500 processes the working surface 202 of the superlattice 100. This process can include causing exposed edges of the first material layers 102 or the second material layers 104 to be non-conductive. It can also include preferentially exposing edges of one of the first or second material layers 102 and 104.

In the case of causing certain exposed edges to be non-conductive, the platform 500 can insulate certain layers of the first and/or second material layers 102 and 104. In these cases, aspects of the materials in the first and second material layers 102 and 104 can be important.

In one implementation, for instance, the edges of the second material layers 104 are insulated at block 610 while the first material layers 102 are not. This can be performed by oxidizing the second material edges 304 (see FIG. 3). In one implementation, the platform 500 exposes the working surface 202, and thus the first material edges 302 and the second material edges 304, to an oxygen atmosphere. For the first material edges 302 to not be oxidized sufficiently to become non-conductive, the material of the first material layers 102 has an oxidation rate that is lower than the oxidation rate of the material of the second material layers 104.

In another implementation, edges of one of the first and second material layers 102 and 104 are insulated through nitridation. In this implementation, the platform 500 exposes the working surface 202 (along with the first and second edges 302 and 304) to a nitrogen atmosphere under proper conditions of pressure, temperature, plasma, and/or catalyst, etc. Here, one of the first and second material edges 302 and 304 are nitrided sufficiently to be non-conductive at the working surface 202. The material edge that is to remain conductive has a nitridation rate that is lower than the material edge to be made non-conductive.

Figure 9:
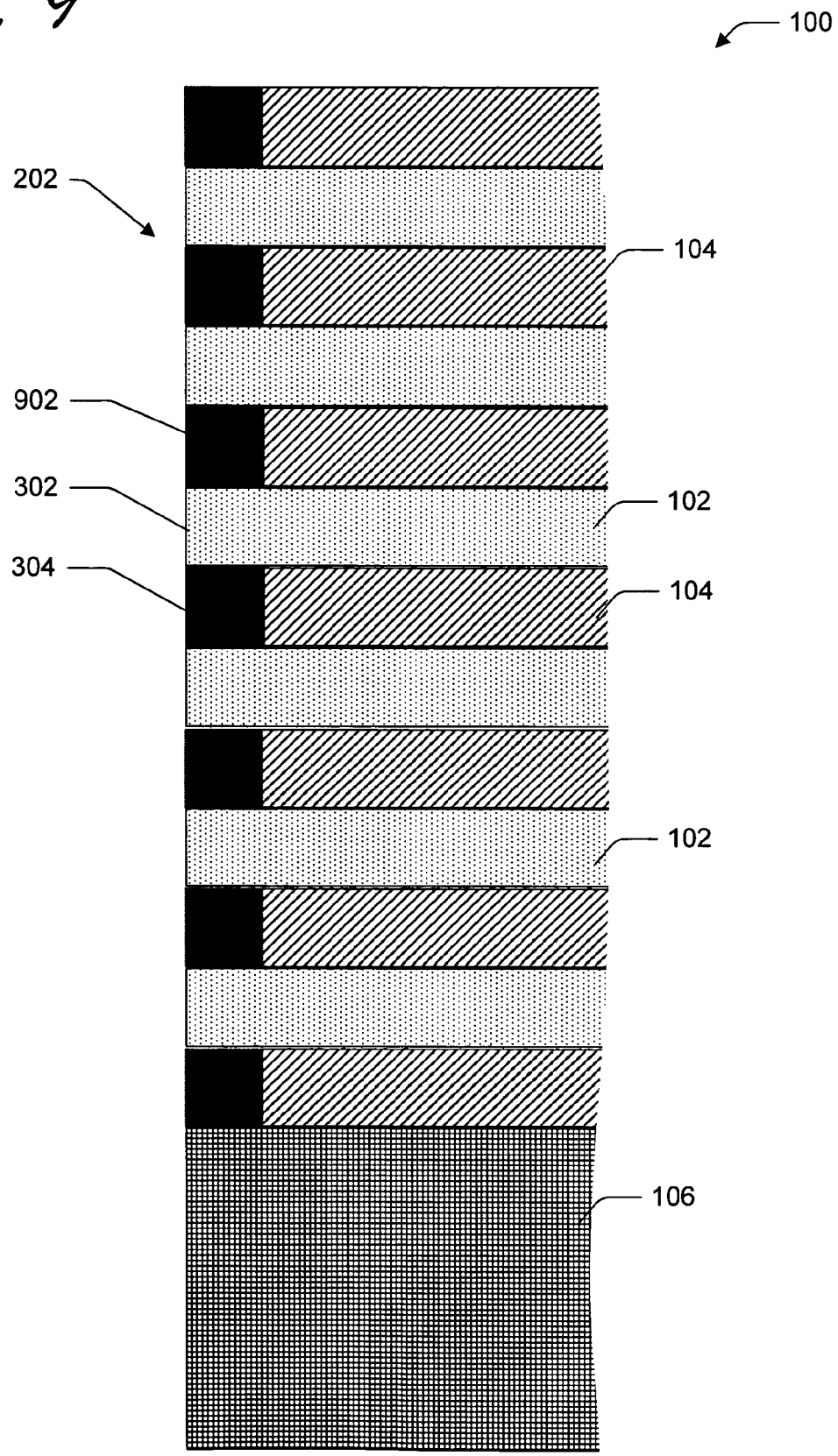
FIG. 9 illustrates a side, cross-sectional view of an exemplary superlattice having alternating layers of materials and with one set of the alternating layers being altered at a working surface.

FIG. 9 sets forth a side, cross-sectional view of examples of the superlattice 100 and the working surface 202 after the second material edges 304 have been altered. In this depiction, the material of the second material layers 104 is conductive, but has been treated such that it is no longer conductive at the working surface 202. As described above, the second material edges 304 (or the first material edges 302, depending on the implementation), can be made non-conductive by being subjected to a nitrogen or oxygen atmosphere.

In one implementation, the material of the second material layers 104 is aluminum and the material of the first material layers 102 is gold. With these being the two materials, subjecting the working surface 202 to an oxygen atmosphere will cause the first material edges 302 to be substantially unchanged, while the second material edges 304 will change from aluminum (a conductor, shown at reference 104) to aluminum oxide (a non-conductor, shown at reference 902). After a sufficient depth of change from aluminum to aluminum oxide has been reached, the second material edges 304 will be effectively non-conductive.

In some cases, however, a certain small amount of alteration to the first material edges 302 is desired. In this implementation, a small amount of change to the first material edges 302 can cause wires created on the first material edges 302 to not adhere as strongly as if there was no change.

Figure 10:
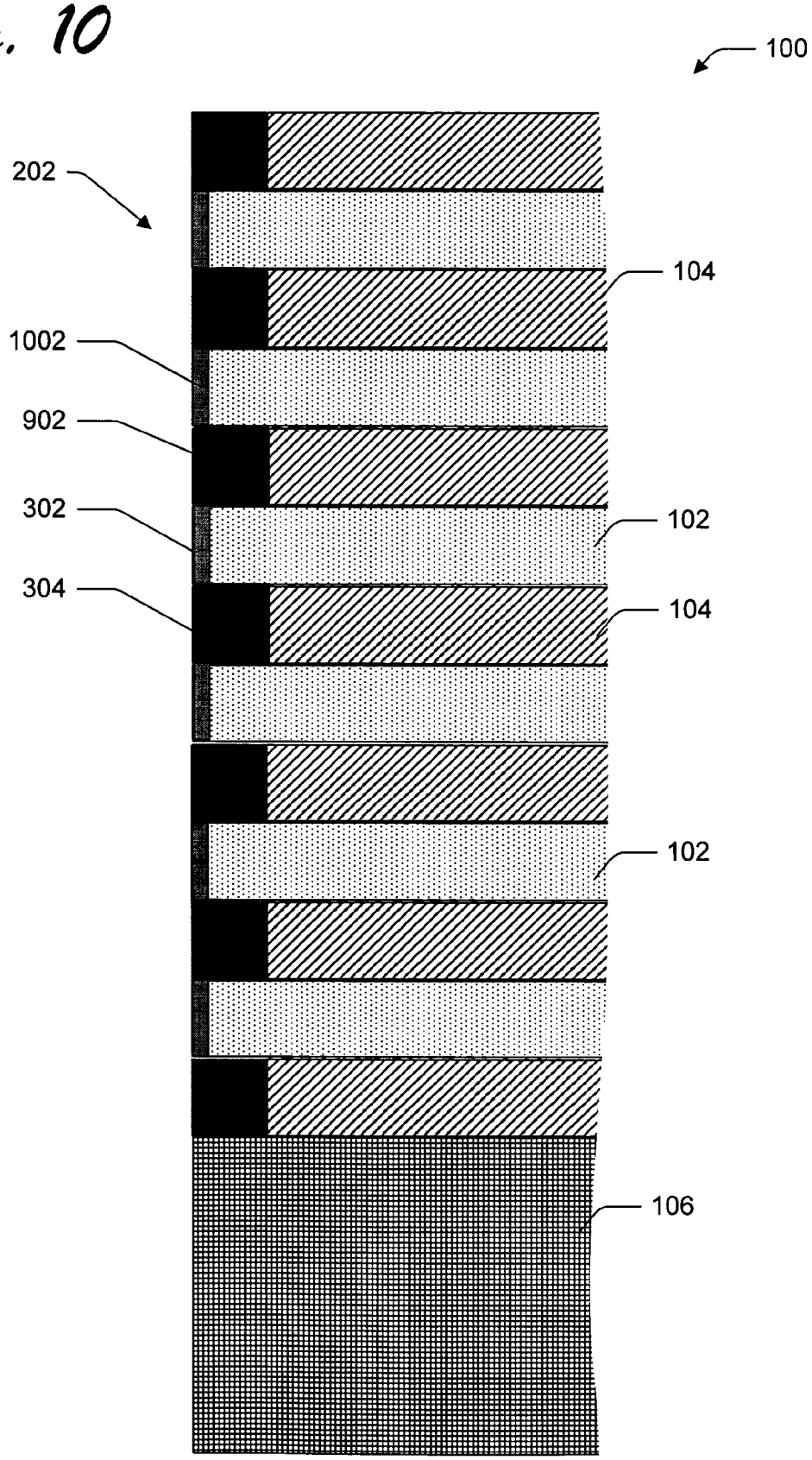
FIG. 10 illustrates a side, cross-sectional view of an exemplary superlattice having alternating layers of materials and with the materials being altered at a working surface.

FIG. 10 sets forth a side, cross-sectional view of examples of the superlattice 100 and the working surface 202 after the first and second material edges 302 and 304 have been altered. In this depiction, the material of the second material layers 104 is conductive, but has been treated such that it is no longer conductive at the working surface 202. The material of the first material layers 102 is also conductive, and has been treated at the working surface 202, but not enough to be non-conductive.

In one implementation, the material of the second material layers 104 is aluminum and the material of the first material layers 102 is tantalum. With these being the two materials, subjecting the working surface 202 to an oxygen atmosphere will cause the first material edges 302 to be changed to a small depth (compared to the depth of the second material edges 304), while the second material edges 304 will change to a comparatively large depth. The aluminum will change to aluminum oxide (shown at the reference 1002). The tantalum will change to tantalum oxide (a non-conductor, shown at reference 902). After a sufficient depth of change from aluminum to aluminum oxide has been reached, the second material edges 304 will be effectively non-conductive. The first material edges 302 can remain conductive but with desirable properties, such as lower adherence to one or more materials used to create wires for the nanowire array. The first material edges here can also be chemically etched in a solution that does not substantially etch the first material edges.

Also as part of block 610, the platform 500 can preferentially expose edges of one of the first or second material layers 102 and 104. Exposing particular edges can include eroding the other edges in various ways. In one implementation, preferentially exposing edges includes etching away whichever of the first or second material layers 102 and 104 is a conductor. Etching the conductive material (in this example, assume that the first material layers 102 are conductive and the second material layers 104 are non-conductive) can be performed to a certain depth. This depth can affect the eventual depth (or height) of wires of the nanowire array.

Figure 11:
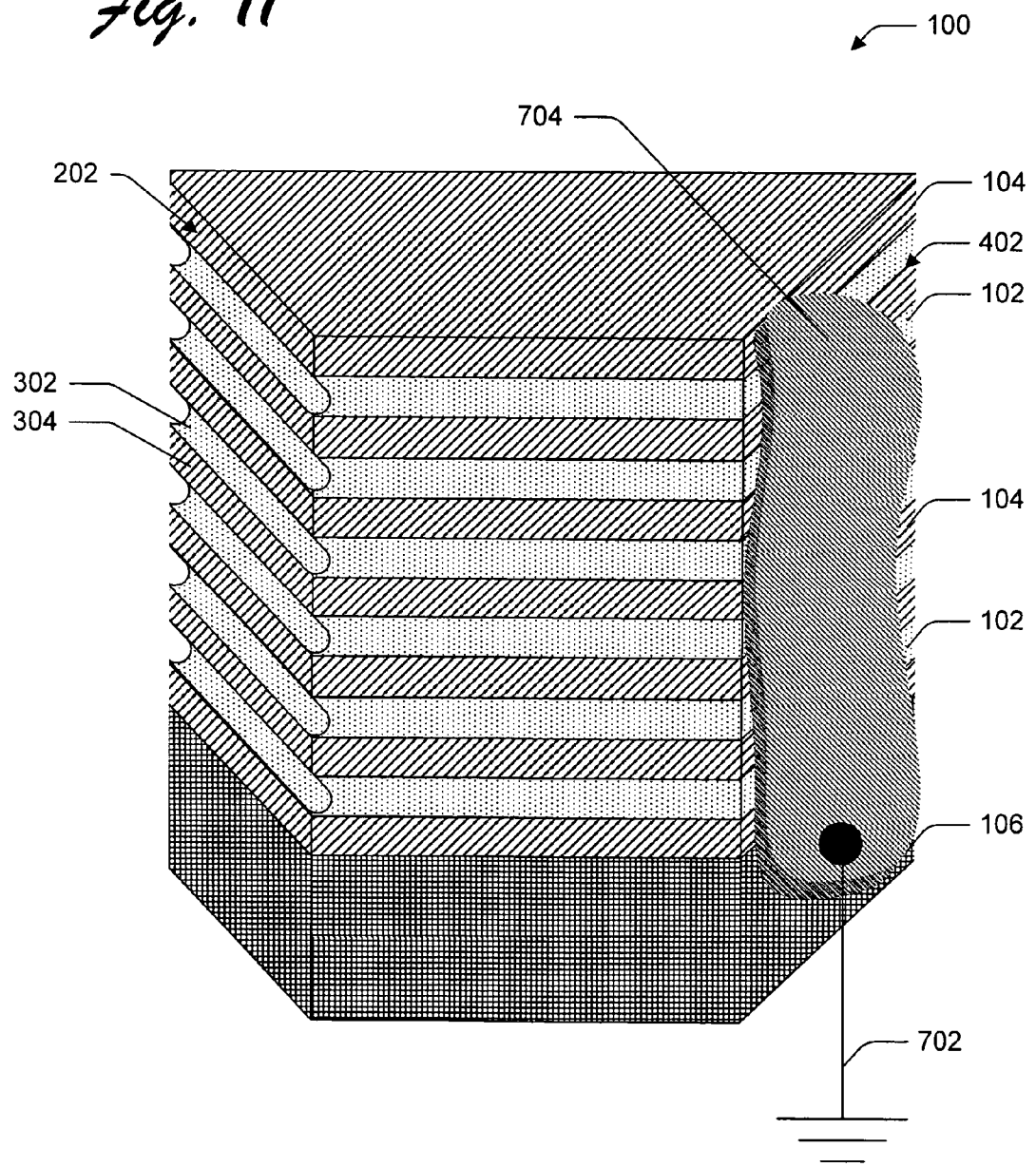
FIG. 11 illustrates a three-dimensional view of an exemplary superlattice having a corrugated working surface and an electrical connection surface in electrical communication with an electrical power sink.

FIG. 11 sets forth a three-dimensional view of examples of the superlattice 100 and the working surface 202 after the first material edges 302 have been eroded. In this depiction, the material of the first material layers 102 is conductive, but has been etched away to produce furrows in the first material layers 102. This exposes the non-conductive material of the second material layers 104, and importantly, creates a furrow for a wire to be created. As is apparent from FIG. 11, this etching causes the working surface 202 to be corrugated. This corrugation can also appear, when viewed parallel to the length, to have a stepped-square, a saw-tooth, or a sine-wave appearance.

To preferentially etch, or erode, one material more than the other, the material of the first or second material layer 102 or 104 that is to be etched has a higher etch rate with respect to the etchant used.

This furrow can be useful in creating wires that are about the depth of the furrows. The furrows also have other benefits, such as protecting the wires from damage and creating a desirable cross-section. This cross section can be rounded on one side and approximately flat on another side. As this other side is later applied to a substrate, this flatness can be an advantage in fixing the wires to the substrate.

In one implementation, the corrugated working surface 202 of FIG. 11 is treated with a low-adhesion layer (not shown).

At block 612, in one implementation the platform 500 proceeds along the "Insulate Only" path to block 608 if part of the working surface 202 was insulated. If it was insulated and etched or otherwise preferentially exposed, the platform 500 proceeds along the "Etch and Insulate" path to block 614. The platform 500 can, however, in some implementations, proceed to block 608 after etching and insulating, prior to proceeding to block 614, to apply a low-adhesion layer to the etched and insulated working surface 202. In other implementations, the platform 500 etches the working surface 202 even when both material layers are conductive. In this implementation, the platform proceeds from block 606 (along the "Yes" path rather than the "No" path) to block 610.

At block 614 the platform 500 exposes edges of conductive material layers to ions. As part of this block 614, the platform 500 exposes the working surface 202 to ions. Those edges (either the first material edges 302 or the second material edges 304) that are conductive at the working surface 202 can attract ions. Over a period of time, collection of ions on a conductive edge will build a wire.

To attract the ions to the conductive edges, the conductive edges are at a different electrical potential or charge than the ions. This can be accomplished in various ways, including by putting the edges in electrical communication with the electrical power sink 702. In the embodiment set forth above, the electrical connection surface 402 is put in electrical communication with the electrical power sink 702. In this example, the communication is established between the electrical connection surface 402 and the working surface 202, by one or both of the first and second material layers 102 and 104 being conductive. If both are conductive except that one is not conductive at the working surface 202, these conductive materials provide electrical communication to the edges that are conductive at the working surface, even though not every one is conductive at the working surface. By so doing, the first material edges 302 or the second material edges 304 (whichever is conductive at the working surface 202), can attract the ions to build wires for the nanowire array.

In one implementation, the platform 500 exposes the working surface 202 to ions by placing the working surface 202 in an ion bath. The ions in the bath can be gold, tantalum, aluminum, or nickel ions, to name a few. The material at the first material edges 302 can also be gold, tantalum, aluminum, or nickel ions, to name a few.

In another implementation, the platform 500 places the working surface 202 in an ion bath of nickel ions, which have a positive charge. In this implementation, the first material edges 302 are made up of tantalum and the second material edges 304 are made up of aluminum oxide. The material of the second material layers 104 is aluminum, but the second material edges 304 have been oxidized. In this example, wires having a nano-scale depth that are made of nickel will form at the first material edges 302 if the first material edges 302 are at a sufficiently negative potential compared with the nickel ions. Continuing this example, the first material edges 302 are at an electric potential that is lower than that of the nickel ions. This lower electric potential provided by electrical communication from the first material edges 302 through the first material layers 102 and the electrical connection surface 402 to the electrical power sink 702. Also in this example, the bath of nickel ions (not shown) is connected to an electrical power source (not shown), that keeps and/or causes them to remain positively charged.

At block 616, the platform 500 electrochemically deposits ions on the edges of the conductive layers. As shown above, the first or second material edges 302 or 304 that are conductive at the working surface 202 will attract ions if the edges are at an appropriate electrical potential compared to the ions. The platform 500 continues to deposit ions on the edges until wires of an appropriate thickness and depth are created. This thickness can be nanometer in scale or more. In one implementation, this thickness is about the same as the depth of the wires. In another implementation, this thickness is less than the depth of the wires, giving the wires a smaller thickness than depth. In still another implementation, this thickness is greater than the depth of the wires.

Figure 12:
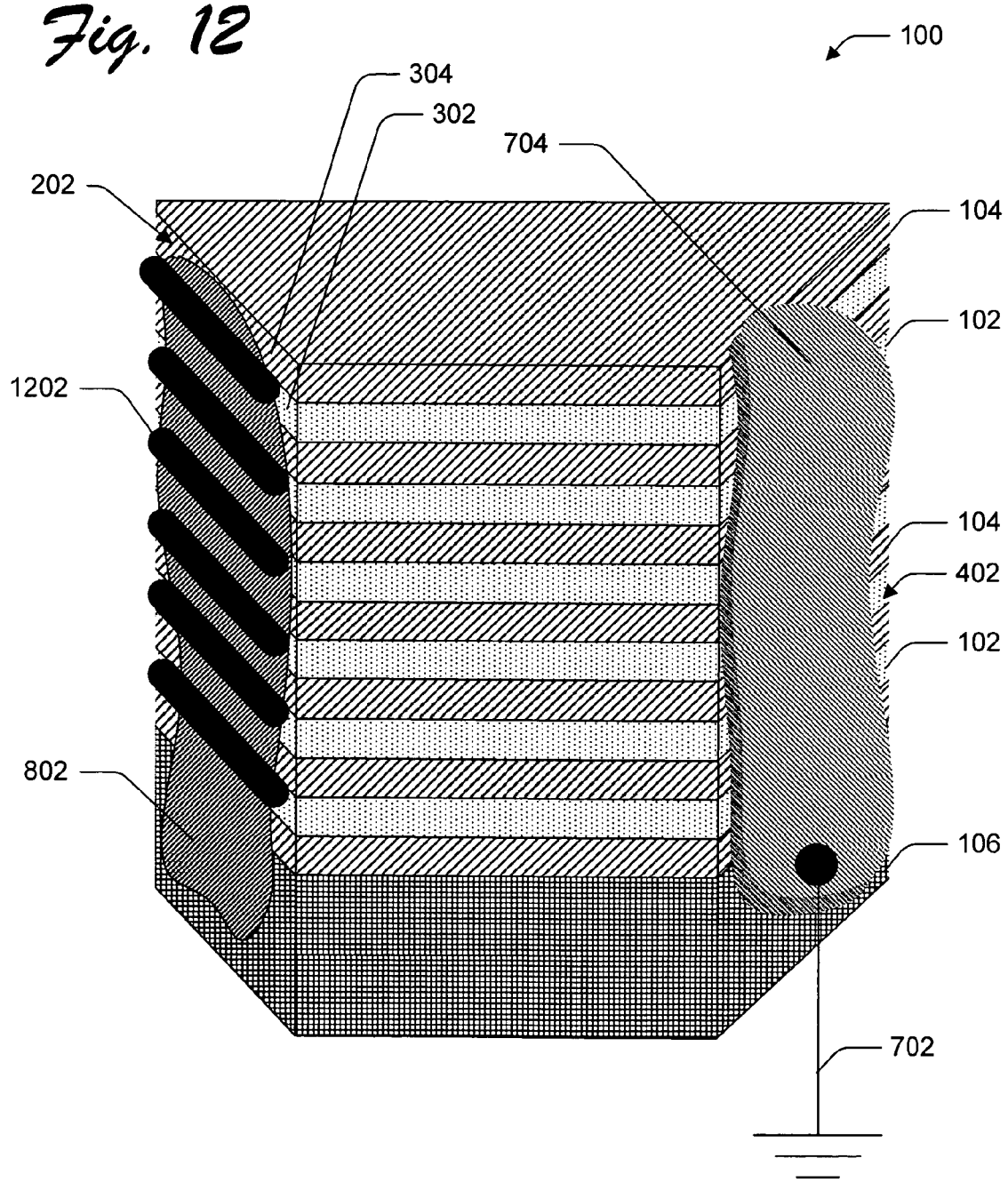
FIG. 12 illustrates a three-dimensional view of an exemplary superlattice having a working surface, the working surface having a low-adhesion layer and material present on alternating layers of the working surface, and an electrical connection surface in electrical communication with an electrical power sink.
Figure 13:
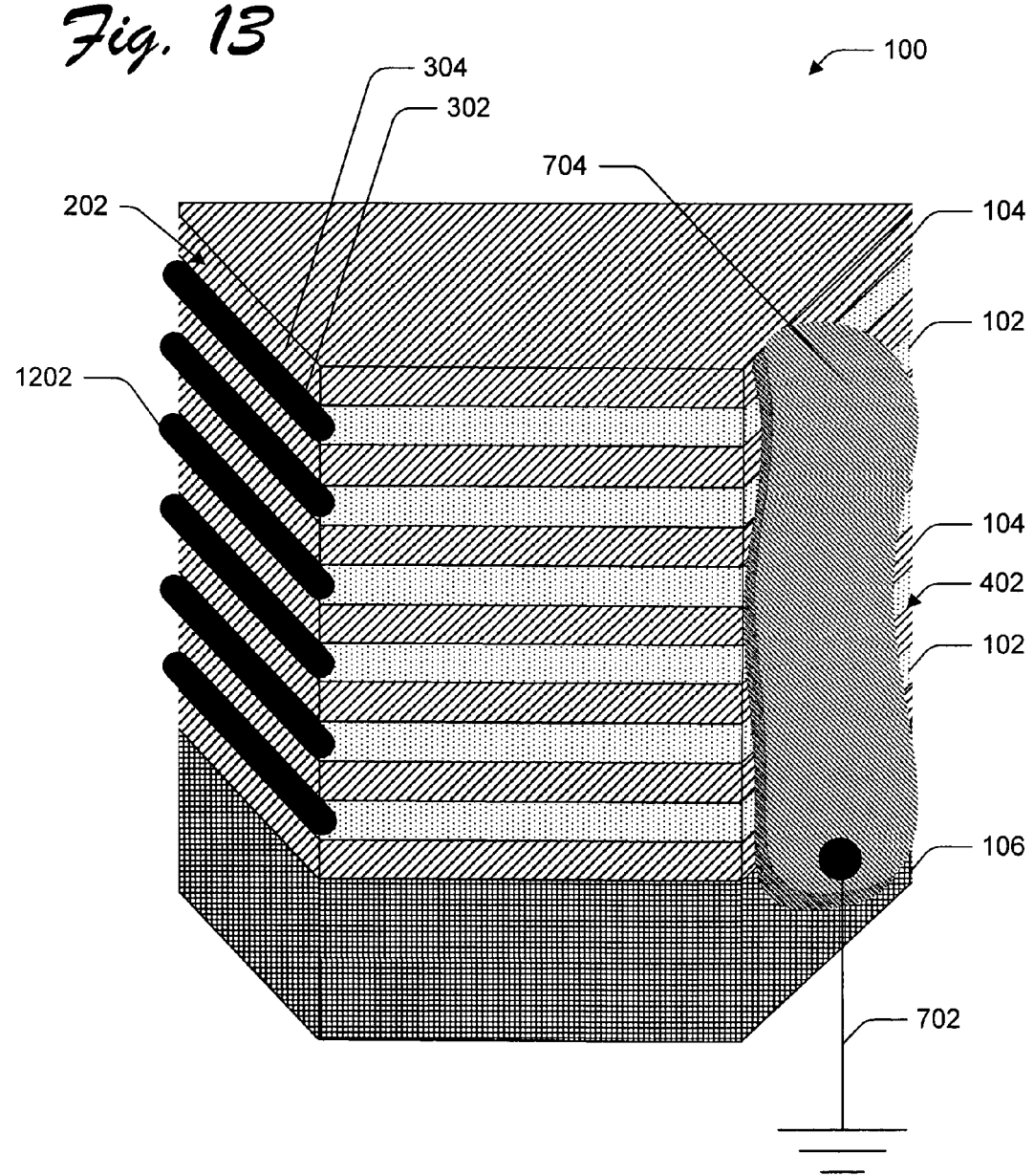
FIG. 13 illustrates a three-dimensional view of an exemplary superlattice having a corrugated working surface, the working surface having material present on alternating layers of the working surface, and an electrical connection surface in electrical communication with an electrical power sink.

FIGS. 12 and 13 show wires built up on an example of the working surface 202.

Specifically, FIG. 12 sets forth a three-dimensional view of an example of the superlattice 100 with examples of the working surface 202, the electrical connection surface 402, the electrical power sink 702, and the low-adhesion layer 802, with exemplary wires 1202 on the working surface 202. Here the wires 1202 are built on the conductive edges (here the first material edges 302) but on top of the low-adhesion layer 802.

Specifically, FIG. 13 sets forth a three-dimensional view of an example of the superlattice 100 with examples of the working surface 202 having a corrugated cross-section, the electrical connection surface 402, the electrical power sink 702, and the wires 1202. Here the wires 1202 are built up within the corrugations caused by eroding the first material layers 102 at the working surface 202.

In yet another implementation of block 616, the platform 500 places the working surface 202 in a bath with other charged objects, which include but are not limited to: ionized inorganic molecules, ionized organic molecules, ionized biological molecules, ionized polymers, charged metal, semiconductor or insulating nanoparticles, and chemical clusters or complexes of the above. In this implementation, the electric field induced by the working surface 202 will result in electro-phoretic deposition of the objects on the conductive edges of the working surface 202. This method makes it possible to form semiconductor, ceramic, organic, polymeric and other types of nanowires.

In still another implementation of block 616, the electric field generated by the working surface 202 induces a chemical reaction between dissolved chemicals and water (in a bath in which the working surface 202 is placed), on the conductive edges of the working surface 202. This results in electrolytic deposition of the reaction products on the conductive edges, forming nanowires.

At block 618, the platform 500 provides an array substrate. This array substrate acts to hold the wires formed on the working surface 202.

FIG. 14 sets forth examples of the superlattice 100, the working surface 202, the low-adhesion layer 802, the wires 1202, and an exemplary array substrate 1400. The array substrate 1400 includes a high-adhesion layer 1402. This high-adhesion layer 1402 facilitates transfer of the wires 1202 from the superlattice 100 to the array substrate 1400. The high-adhesion layer 1402 acts with an adhesion force greater than the adhesion force between the wires 1202 and the working surface 202. If there is a low-adhesion layer 802 between the wires 1202 and the working surface 202, the high-adhesion layer 1402 may be of an adhesion force that is only moderate or moderately low, but that is greater than the adhesion force of the low-adhesion layer 802 on the wires 1202.

At block 620, the platform 500 contacts the wires 1202 to the array substrate 1400. By so doing, the wires 1202 are transferred from the superlattice 100 to the array substrate 1400.

FIG. 14 shows the array substrate 1400 and the superlattice 100 prior to being placed in physical contact. After the platform 500 touches the wires 1202 to the high-adhesion layer 1402 of the array substrate 1400, the wires 1202 are transferred to the array substrate 1400.

At block 622, the platform 500 removes the superlattice 100 from the array substrate 1400, leaving the wires 1202 on the array substrate 1400.

Figure 15:
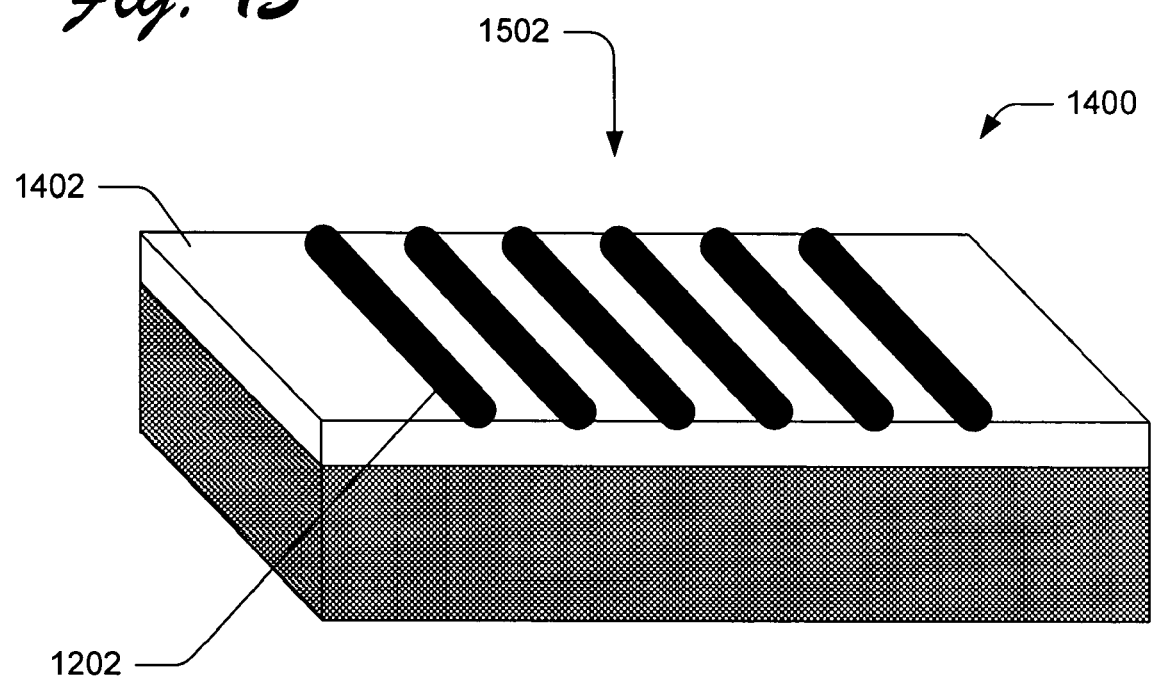
FIG. 15 illustrates a three-dimensional view of an exemplary array substrate with wires of material on one of the array substrate's surfaces.

FIG. 15 sets forth an example of the array substrate 1400 and the wires 1202 after the wires 1202 are transferred. Here the array substrate 1400 includes an exemplary array 1502 of the wires 1202.

FIG. 16 shows a flow diagram 1600 for electrochemically creating a nanowire array. This flow diagram 1600 sets forth an exemplary method for creating a nanowire array, here using electrochemical dissolution and electroplating to transfer material from the superlattice 100 to a substrate.

In another implementation (not shown), material is transferred from the substrate to the superlattice. In this other implementation, the substrate has a thin conductive film and the superlattice is used electrochemically to etch the substrate's thin conductive film into an array of nanowires. Thus, material from the substrate's thin conductive film that remains after the etching is a nanowire array.

At block 1602, the platform 500 provides the superlattice 100. This can be performed with one of the exemplary superlattices 100 set forth above. In one implementation, the platform 500 provides the superlattice 100 shown in FIG. 4, which has the working surface 202 and the electrical connection surface 402.

At block 1604, the electrical power sink 702 is attached to the electrical connection surface 402. The electrical power sink 702 can be a source or ground/sink.

At block 1606, the platform 500 erodes one of the first or second material layers 102 or 104 at the working surface 202. This erosion can be performed by etching or in other manners, similar to as set forth in the above description concerning exposing, erosion, and/or etching.

In one implementation, the platform 500 etches the second material layers 104 at the working surface 202. This creates a corrugated working surface 202, with the first material edges 302 protruding beyond that of the second material layers 304.

Figure 17:
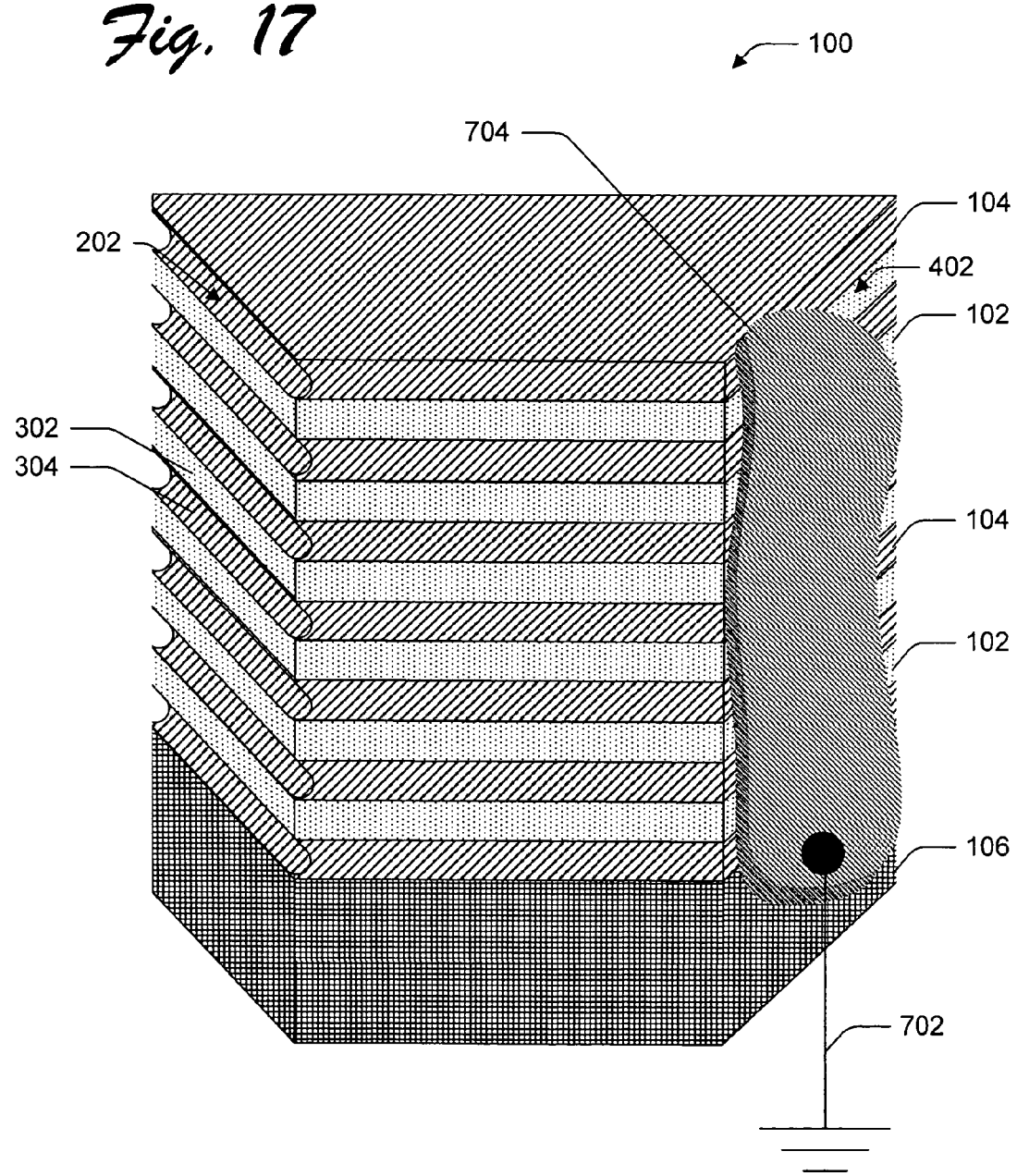
FIG. 17 illustrates a three-dimensional view of an exemplary superlattice having a working surface, the working surface having alternating layers being eroded, and an electrical connection surface being in electrical communication with an electrical power sink.

FIG. 17 sets forth a three-dimensional view of examples of the superlattice 100 and the working surface 202 after the second material edges 304 have been eroded. In this depiction, the material of the first material layers 102 is conductive, but has been exposed beyond that of the second material layers 104 by the second material layers 104 being etched away to produce furrows in the second material layers 104. This preferentially exposes the conductive material of the first material layers 102 at the working surface 202. As is apparent from FIG. 17, this etching causes the working surface 202 to be corrugated and the first material edges 302 to extend beyond the second material edges 304.

At block 1608 the platform provides a conductive receiving substrate. This conductive receiving substrate is usable to transfer material from layers of the first material layers 102 or the second material layers 104. Material can be transferred in small quantities, but sufficient to create nanoscale wires of sufficient depth from the edges of the first and/or second material edges 302 and 304.

At block 1610, the platform 500 dissolves conductive material from one or more edges of the material layers to deposit the conductive material on the conductive receiving substrate. This can be performed in various manners, including by electrochemical deposition from exposed edges of the layers to the conductive receiving substrate.

Figure 18:
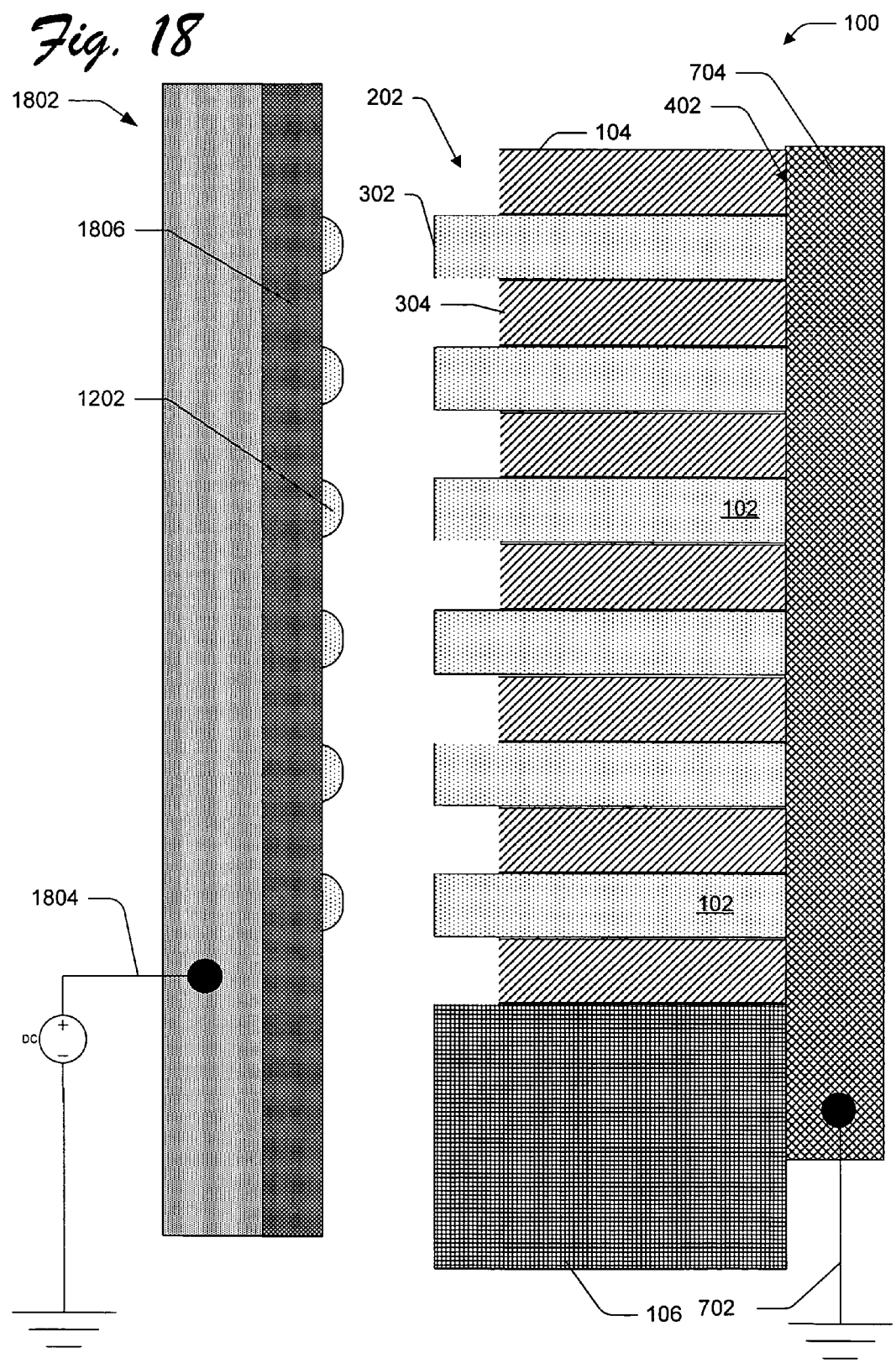
FIG. 18 illustrates a side, cross-sectional view of an exemplary superlattice having alternating layers of materials that are corrugated along a working surface, an electrical connection surface being in electrical communication with an electrical power sink, and an exemplary conductive receiving substrate being in electrical communication with an electrical power source and having one material from the working surface of the superlattice being deposited on a surface of the conductive receiving substrate.

In one implementation, shown in part in FIG. 18, material from the first material edges 302 is transferred to create wires on the conductive receiving substrate. To facilitate this transfer of material, the first material edges 302 and the conductive receiving substrate are at different electric potentials.

FIG. 18 sets forth a side, cross-sectional view of examples of the superlattice 100, the working surface 202, the electrical connection surface 402, and the electrical power sink 702, with working surface 202 having the first material edges 302 extending beyond the second material edges 304. FIG. 18 also sets forth an exemplary conductive receiving substrate 1802 in electrical communication with an electrical power source 1804. In this implementation, the conductive receiving substrate 1802 includes an insulating layer 1806 on which the wires 1202 are built.

The platform 500 can facilitate transfer of material from the first material edges 302 to the conductive receiving substrate 1802 by placing the exposed edges (here the first material edges 302) very close to the conductive receiving substrate 1802. In one implementation, the platform 500 places these within nanometers of each other. In another, within tens of nanometers of each other. The proximity affects the fineness of the deposited lines.

Also to facilitate transfer of material, the platform 500 can place the conductive receiving substrate 1802 and the first material edges 302 within an electrolyte capable of carrying ions of materials present at the first material edges 302.

In the ongoing example set forth in part in FIG. 18, the platform 500 places the first material edges 302 and the conductive receiving substrate 1802 within an electrolyte capable of dissolving the materials at the first material edges 302. In one example, the material in the first material edges 302 is nickel. In this example, the nickel is dissolved by the electrolyte to become nickel ions. These nickel ions are charged particles and are attracted to the conductive receiving substrate 1802. The nickel ions then, over time, build up on the layer 1806 of the conductive receiving substrate 1802, forming the wires 1202 of nickel. After a desired thickness and depth of the wires 1202 is achieved, the platform 500 removes the conductive receiving substrate 1802 from the working surface 202 of the superlattice 100.

The materials in the exposed first material edges 302 can include multiple materials. In one implementation, illustrated in part in FIG. 19, the first material edges 302 include four different materials.

FIG. 19 sets forth a side, cross-sectional view of examples of the superlattice 100, the working surface 202, the electrical connection surface 402, and the electrical power sink 702, and working surface 202 having the first material edges 302 extending beyond the second material edges 304 and including multiple materials. FIG. 19 also sets forth an example of the conductive receiving substrate 1802 in electrical communication with the electrical power source 1804. In this implementation, the conductive receiving substrate 1802 includes the insulating layer 1804 on which the wires 1202 are built.

In this implementation, the platform 500 places the first material edges 302 within an electrolyte capable of dissolving each of the four materials. These materials can include, for example, alternating layers of the first material layers 102 of tantalum, nickel, aluminum, and gold. The platform 500 then proceeds as above.

If, however, a particular spacing is needed, an electrolyte incapable of sufficiently dissolving one or more of the four materials can be used, thereby creating wires in an array that have larger spaces between certain of the wires.

Nanowire arrays fabricated with the methods described herein can also be used for further processing and fabrication of other types of nanowires. In one implementation, nanowires are fabricated on top of a thin metal or semiconductor film. Then these nanowires are used as a hard mask to etch away the material of the film, thereby creating another set of nanowires made of the material of the film.

Although the invention is described in language specific to structural features and methodological steps, it is to be understood that the invention defined in the appended claims is not necessarily limited to the specific features or steps described. Rather, the specific features and steps disclosed represent preferred forms of implementing the claimed invention.

What is claimed is:

1. A method of fabricating nanometer-thickness wires, comprising:
   providing a working surface of a superlattice having alternating layers of a first conductive material and one or more other materials, the working surface comprising exposed edges of the alternating layers, the exposed edges having a thickness and a length;
   treating the working surface to cause the exposed edges of the other materials to be non-conductive; and
   exposing the working surface to
     ions of a second conductive material and electrochemically depositing the ions on or near the exposed edges of the first conductive material layers to create wires made of the second conductive material,
     charged molecules or charged nano-objects and electrophoretically depositing the charged molecules or charged nano-objects on or near the exposed edges of the first conductive material layers to ornate wires made of the molecules or nano-objects, and/or
     a bath of water having a dissolved chemical and inducing a chemical reaction between the dissolved chemical and water to induce electrolytically depositing a reaction product of the reaction on or near the exposed edges of the first conductive material layers to create wires made of the reaction product.

2. The method of claim 1, wherein treating the working surface comprises oxidizing the working surface to oxidize the exposed edges of the other materials to be non-conductive.

3. The method of claim 1, further comprising etching the working surface to erode the exposed edges of the first conductive material to be a distance away from the working surface along a depth perpendicular to the length and the thickness.

4. The method of claim 1, further comprising etching the working surface to erode the exposed edges of the first conductive material to be a distance away from the exposed edges of the other materials along a depth perpendicular to the thickness and the length, and wherein the depositing is performed until the wires fill up the distance between the exposed edges of the first conductive material and the working surface.

5. The method of claim 1, wherein the electrochemically depositing includes creating a voltage difference between the exposed edges of the first conductive material layers and a bath containing the ions.

6. The method of claim 1, wherein the electrochemically depositing includes:
   creating a voltage difference between the exposed edges of the first conductive material layers and a bath containing the ions, and wherein the creating the voltage difference includes:
   creating a connecting surface and connecting the connecting surface to a first voltage source; and
   connecting a second voltage source to the bath containing the ions.

7. The method of claim 1, wherein the charged molecules or charged nano-objects include ionized inorganic molecules, ionized organic molecules, ionized biological molecules, ionized polymers, charged metal, semiconductor or insulating nanoparticles.

8. The method of claim 1, wherein the reaction product includes oxides and ceramics.

9. A method of fabricating nanometer-thickness wires, comprising:
   providing a working surface of a superlattice having alternating layers of a first conductive material and one or more other materials, the working surface comprising exposed edges of the alternating layers, the exposed edges having a thickness and a length;
   applying a thin, low-adhesion layer to the working surface that does not substantially interfere with a conductive property of the exposed edges of the first conductive material layers; and
   exposing the working surface to
     ions of a second conductive material and electrochemically depositing the ions on or near the exposed edges of the first conductive material layers to create wires made of the second conductive material,
     charged molecules or charged nano-objects and electrophoretically depositing the charged molecules or charged nano-objects on or near the exposed edges of the first conductive material layers to create wires made of the molecules or nano-objects, and/or
     a bath of water having a dissolved chemical and inducing a chemical reaction between the dissolved chemical and water to induce electrolytically depositing a reaction product of the reaction on or near the exposed edges of the first conductive material layers to create wires made of the reaction product.

10. The method of claim 9, further comprising:
providing a substrate having a high-adhesion layer;
contacting the wires that are on the exposed edges of the first conductive material layers onto the high-adhesion layer; and
removing the exposed edges of the first conductive material layers to release the wires from the exposed edges of the first conductive material layers.

11. The method of claim 9, further comprising:
providing a substrate having a high-adhesion layer;
contacting the wires that are on the exposed edges of the first conductive material layers onto the high-adhesion layer; and
removing the exposed edges of the first conductive material layers to leave the wires on the high-adhesion layer of the substrate.

12. The method of claim 9, further comprising:
providing a substrate having a second adhesion layer, the second adhesion layer having a higher coefficient of adhesion with respect to the wires than the first adhesion layer;
contacting the wires that are on the exposed edges of the first conductive material layers onto the second adhesion layer; and
removing the exposed edges of the first conductive material layers to leave the wires on the second adhesion layer.

13. The method of claim 9, further comprising treating the working surface to cause the exposed edges of the other materials to be non-conductive.

14. The method of claim 9, further comprising etching the working surface to erode the exposed edges of the first conductive material to be a distance away from the working surface along a depth perpendicular to the length and the thickness.

15. The method of claim 9, further comprising etching the working surface to erode the exposed edges of the first conductive material to be a distance away from the exposed edges of the other materials along a depth perpendicular to the thickness and the length, and wherein the depositing is performed until the wires fill up the distance between the exposed edges of the first conductive material and the working surface.

16. The method of claim 9, wherein the electrochemically depositing includes creating a voltage difference between the exposed edges of the first conductive material layers and a bath containing the ions.

17. The method of claim 9, wherein the electrochemically depositing includes:
creating a voltage difference between the exposed edges of the first conductive material layers and a bath containing the ions, and wherein the creating the voltage difference includes:
creating a connecting surface and connecting the connecting surface to a first voltage source; and
connecting a second voltage source to the bath containing the ions.

18. The method of claim 9, wherein the charged molecules or charged nano-objects include ionized inorganic molecules, ionized organic molecules, ionized biological molecules, ionized polymers, charged metal, semiconductor or insulating nanoparticles.

19. The method of claim 9, wherein the reaction product includes oxides and ceramics.

* * * * *